(12) United States Patent
Lablans

(10) Patent No.: US 7,355,444 B2
(45) Date of Patent: Apr. 8, 2008

(54) SINGLE AND COMPOSITE BINARY AND MULTI-VALUED LOGIC FUNCTIONS FROM GATES AND INVERTERS

(75) Inventor: Peter Lablans, Morris Township, NJ (US)

(73) Assignee: Ternarylogic LLC, Morristown, NJ (US)

( * ) Notice: Subject to any disclaimer, the term of this patent is extended or adjusted under 35 U.S.C. 154(b) by 0 days.

(21) Appl. No.: 11/686,542

(22) Filed: Mar. 15, 2007

(65) Prior Publication Data

US 2007/0152710 A1    Jul. 5, 2007

Related U.S. Application Data

(63) Continuation of application No. 11/000,218, filed on Nov. 30, 2004, now Pat. No. 7,218,144, which is a continuation-in-part of application No. 10/935,960, filed on Sep. 8, 2004.

(60) Provisional application No. 60/547,683, filed on Feb. 25, 2004.

(51) Int. Cl.
*H03K 19/00* (2006.01)
(52) U.S. Cl. .......................... 326/59; 326/104
(58) Field of Classification Search .................. 326/37, 326/38, 59, 60, 104, 113
See application file for complete search history.

(56) References Cited

U.S. PATENT DOCUMENTS

| | | | |
|---|---|---|---|
| 3,129,340 A | 4/1964 | Baskin | |
| 3,142,037 A | 7/1964 | Gazale | |
| 3,210,529 A | 10/1965 | Hanson | |
| 3,283,256 A | 11/1966 | Hurowirz | |
| 3,492,496 A | 1/1970 | Callan | |
| 3,515,805 A | 6/1970 | Fracassi et al. | |
| 3,586,022 A | 6/1971 | Bauer | |
| 3,649,915 A | 3/1972 | Mildonian | |
| 3,656,117 A | 4/1972 | Maley et al. | |
| 3,660,678 A | 5/1972 | Maley et al. | |
| 3,663,837 A | 5/1972 | Epstein et al. | |
| 3,671,764 A | 6/1972 | Maley et al. | |
| 3,718,863 A | 2/1973 | Fletcher et al. | |
| 3,760,277 A | 9/1973 | Whang | |
| 3,866,147 A * | 2/1975 | De Couvreur et al. | 341/57 |
| 3,988,538 A | 10/1976 | Patten | |
| 3,988,676 A | 10/1976 | Whang | |
| 4,304,962 A | 12/1981 | Fracassi et al. | |
| 4,378,595 A | 3/1983 | Current | |
| 4,383,322 A | 5/1983 | Halpern et al. | |
| 4,775,984 A | 10/1988 | Jaffre et al. | |
| 4,808,854 A | 2/1989 | Reinagel | |
| 4,815,130 A | 3/1989 | Lee | |
| 4,984,192 A | 1/1991 | Flynn | |
| 4,990,796 A | 2/1991 | Olson | |

(Continued)

*Primary Examiner*—Don Le
(74) *Attorney, Agent, or Firm*—Diehl Servilla LLC; Glen M. Diehl

(57) ABSTRACT

Gates or switches for use in circuits implementing ternary and multi-value functions are disclosed. The gates can be optical, mechanical or electrical. The gates can conduct or not conduct when a control input assumes one of multiple states, or when a control input assumes two or more of multiple states. Circuits and methods for implementing ternary and multi-value functions are also disclosed. Corrective design techniques that can be used when a logic expression is incorrectly realized are also disclosed. Circuits that use inverters and gates to realize logic expressions are also provided.

9 Claims, 26 Drawing Sheets

U.S. PATENT DOCUMENTS

| | | |
|---|---|---|
| 5,017,817 A | 5/1991 | Yamakawa |
| 5,230,003 A | 7/1993 | Dent et al. |
| 5,412,687 A | 5/1995 | Sutton et al. |
| 5,563,530 A * | 10/1996 | Frazier et al. .............. 326/132 |
| 5,621,580 A | 4/1997 | Cruz et al. |
| 5,714,892 A | 2/1998 | Bowers et al. |
| 5,724,383 A | 3/1998 | Gold et al. |
| 5,761,239 A | 6/1998 | Gold et al. |
| 5,790,265 A | 8/1998 | Shikakura |
| 5,790,591 A | 8/1998 | Gold et al. |
| 5,856,980 A | 1/1999 | Doyle |
| 5,917,914 A | 6/1999 | Shaw et al. |
| 5,959,871 A | 9/1999 | Pierzchala et al. |
| 5,978,412 A | 11/1999 | Takai |
| 5,999,542 A | 12/1999 | Turner et al. |
| 6,122,376 A | 9/2000 | Rao |
| 6,133,753 A | 10/2000 | Thomson et al. |
| 6,133,754 A | 10/2000 | Olson |
| 6,192,257 B1 | 2/2001 | Ray |
| 6,320,897 B1 | 11/2001 | Fattouche et al. |
| 6,452,958 B1 | 9/2002 | van Nee |
| 6,477,205 B1 | 11/2002 | Doblar et al. |
| 6,519,275 B2 | 2/2003 | Callaway et al. |
| 2002/0089364 A1 | 7/2002 | Goldgeisser et al. |
| 2003/0072449 A1 | 4/2003 | Myszne |
| 2003/0099359 A1 | 5/2003 | Hui |
| 2003/0165184 A1 | 9/2003 | Welborn et al. |
| 2004/0021829 A1 | 2/2004 | Griffin |
| 2004/0032918 A1 | 2/2004 | Shor et al. |
| 2004/0032949 A1 | 2/2004 | Forest |
| 2004/0037108 A1 | 2/2004 | Notani |
| 2004/0042702 A1 | 3/2004 | Akimoto |
| 2004/0068164 A1 | 4/2004 | Diab et al. |
| 2004/0085937 A1 | 5/2004 | Noda |
| 2004/0091106 A1 | 5/2004 | Moore et al. |
| 2006/0082386 A1* | 4/2006 | Katrak et al. .................. 326/59 |

* cited by examiner

SINGLE AND COMPOSITE BINARY AND MULTI-VALUED LOGIC FUNCTIONS FROM GATES AND INVERTERS

This patent application is a continuation of U.S. patent application Ser. No. 11/000,218, filed on Nov. 30, 2004, entitled SINGLE AND COMPOSITE BINARY AND MULTI-VALUED LOGIC FUNCTIONS FROM GATES AND INVERTERS which is hereby incorporated herein by reference in its entirety, which is a continuation-in-part of U.S. patent application Ser. No. 10/935,960, filed on Sep. 8, 2004, entitled TERNARY AND MULTI-VALUE DIGITAL SCRAMBLERS, DESCRAMBLERS AND SEQUENCE GENERATORS, which is hereby incorporated herein by reference in its entirety, and which claims priority to U.S. Provisional Application No. 60/547,683, filed Feb. 25, 2004.

BACKGROUND OF THE INVENTION

This invention relates to the realization of binary and multi-valued digital (non-binary) logic devices by implementing binary and multi-valued two input/single output functions. More specifically, it relates to realizing these functions by applying externally controlled conducting and non-conducting gates and binary and multi-valued inverters.

The foundation of digital binary electronics lies in the translation of binary logic into 2-valued switches. This translation can be performed in such a way that with a limited set of binary logic functions all possible binary logic functions can be realized.

It is well known that with a set of two binary switching functions (the NOT and the NAND function) all other binary functions can be realized. The NOT and NAND functions are said to form an adequate set of connectives.

All 16 binary (two inputs/single output) functions can thus be created from the NOT and the AND function. Those functions include the well known AND, OR, NAND, NOR, NOT and XOR functions.

Using the NOT and NAND function to create other logic functions is not always the most economical way to do so. For instance, implementing the exclusive or (XOR) function this way will require 3 NAND and two NOT functions. There are better, more economical ways to implement this function.

A similar theory can be applied to ternary and multi-valued logic. In multi-value logic, a logic state can assume one of x values where x is greater than or equal to 3. One can find adequate sets of ternary connectives. Unfortunately, creation of the rest of the ternary functions from the set of adequate ternary connectives may not be efficient. Another disadvantage may be that the ternary functions in the adequate set may not be easy to realize.

The approach of applying the ternary set of adequate connectives (and of any multi-valued connectives) may not be an economical or even a possible way to realize all other ternary (or multi-valued) functions. While it may be possible to find a limited set of multi-valued connectives, it may take too many of these connectives to realize desirable functions. It may also be very difficult to find physical switching mechanisms that can realize the individual connectives.

The current way of realizing binary or in general digital switching circuits is by first finding a mathematical logic expression that describes the functions that have to be realized. In general, the selected functions represent realizable logic devices. An important mathematical property of these expressions is the associative property, which affects the way how they can be grouped. This combined with the causal property (which means that an expression has to be executed before its result is available) determines largely how a logical expression is realized with logical devices. These properties become apparent in circuits such as digital ripple adders. Several approaches exist to minimize the number of logic functions and execution steps in what is generally called multi-level logic expressions. The overall speed of executing a multi-level logic expression is generally limited by its level of complexity and the related propagation delays of the individual functions.

Accordingly, there is a need for providing for and improving the implementation of ternary and multi-value functions.

SUMMARY OF THE INVENTION

The present invention provides gates or switches for use in circuits implementing ternary and multi-value functions are disclosed. The gates can be optical, mechanical or electrical. The gates can conduct or not conduct when a control input assumes one of multiple states, or when a control input assumes two or more of multiple states.

Circuits and methods for implementing ternary and multi-value functions are also disclosed. The circuits and methods preferably use gates and inverters to realize the functions.

Corrective design techniques that can be used when a logic expression is incorrectly realized are also disclosed.

Circuits that use inverters and gates to realize logic expressions are also provided. These circuits use the variables in the logic expression to control the gates.

In view of the more limited possibilities of the prior art in use of adequate sets of connectives in ternary and multi-valued logic, there is a clear need for a simple and easy to implement method to create ternary and multi-valued functions based on a limited set of ternary and multi-valued functional components.

There is also a need to create faster methods to execute binary logic expressions.

The general purpose of the present invention, which will be described subsequently in greater detail, is to provide methods of creating devices which will have functions described by binary and multi-valued truth tables.

Before explaining at least one embodiment of the invention in detail it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

Multi-value and n-value in the context of this application mean a number n, with n being a positive integer greater than two.

A primary object of the present invention is to provide a new method for creating devices that will realize binary and multi-valued logic functions described by binary and multi-valued truth tables.

An object of the present invention is to provide a method to realize any binary two inputs/single output logic device described by a binary truth table by applying binary individually enabled gates and a binary logic inverter.

Another object of the present invention is to provide circuits comprising a plurality of similar or different individual binary logic devices applying binary individually enabled gates and binary logic inverters.

Another object of the present invention is to provide circuits and methods realizing composite binary logic expressions with minimum propagation time by applying binary individually enabled gates and binary logic inverters.

Another object of the present invention is to provide a ternary switching device that is controlled by a ternary signal that conducts a signal if the controlling signal has state 0.

Another object of the present invention is to provide a ternary switching device controlled by a ternary signal that does not conduct a signal if the controlling signal has state 0.

Another object of the present invention is to provide a ternary switching device controlled by a ternary signal that does conduct a signal if the controlling signal has one of three designated states.

Another object of the present invention is to provide a ternary switching device controlled by a ternary signal that does not conduct a signal if the controlling signal has one of three designated states.

Another object of the present invention is to provide circuits comprising a plurality of similar or different individual ternary logic devices applying ternary individually enabled gates and ternary logic inverters.

Another object of the present invention is to provide circuits and methods realizing composite ternary logic expressions with minimum propagation time by applying ternary individually enabled gates and ternary logic inverters.

Another object of the present invention is to provide an n-valued (with n an integer greater than 3) switching device (method) controlled by an n-valued signal that does conduct a signal if the controlling signal has one of n designated states.

Another object of the present invention is to provide an n-valued (with n an integer greater than 3) switching device controlled by an n-valued signal that does not conduct a signal if the controlling signal has one of n designated states.

Another object of the invention is to provide a method (device or apparatus) to realize any ternary 2 inputs logic function from ternary inverters and ternary signal controlled conducting and non-conducting switches.

Another object of the invention is to provide a method (device or apparatus) to realize any 2-inputs n-valued logic function from n-valued inverters and n-valued signal controlled conducting and non-conducting switches.

Another object of the present invention is to provide circuits comprising a plurality of similar or different individual n-valued logic devices applying n-valued individually enabled gates and n-valued logic inverters.

Another object of the present invention is to provide circuits and methods realizing composite n-valued logic expressions with minimum propagation time by applying n-valued individually enabled gates and n-valued logic inverters.

Another object of the present invention is to provide circuits and methods realizing composite binary or 2-valued logic expressions with minimum propagation time by applying binary or 2-valued individually enabled gates and the binary or 2-valued logic inverter.

Consequently the present invention provides a method to create any n-value logic function, thus enabling the practical use of n-valued logic in the field of electronics and optics and their related applications.

BRIEF DESCRIPTION OF THE DRAWINGS

Various other objects, features and attendant advantages of the present invention will become fully appreciated as the same becomes better understood when considered in conjunction with the accompanying drawings.

DETAILED DESCRIPTION OF THE INVENTION

Binary Logic Expressions

To explain the concepts and methods of the invention, complex logical expressions related to multi-digit binary addition will be used for illustrative purposes only. It should be clear to those skilled in the art that the invention and methods herein described apply to any composite logical expression. It should also be clear that additional minimization methods to reduce the complexity of expressions can be applied. Though these minimization methods are very useful and thus recognized, they are not essential to the invention here described.

The logic functions that are described in the next few paragraphs are in the form of two input/single output functions. The functions are described by binary truth tables of which there are 16 different ones.

A binary logic device executing such a two input/single output logic function r1 can be described in formula as: s→a r1 b. The inputs are the binary signals 'a' and 'b', each of which have individual digits that can assume one of two states. The output of the device is a binary signal 's', which also has individual digits that can assume one of two states. The logic device executes the binary function r1. The function r1 can be any of the above identified logic functions.

A more complex expression would be: s→(a r1 b) r2 (c r3 d). This expression describes how a signal 's' can be generated by applying 4 signals: 'a', 'b', 'c' and 'd'. The expression executes the logic functions r1, r2 and r3.

Because of causal device limitations, (expressions (a r1 b) and (c r3 d) have to be executed before (a r1 b) r2 (c r3 d) can be calculated), this expression is almost universally interpreted as a 2-level composite expression. Two level means that the signals propagates through two consecutive levels of logic devices before the end result is generated.

The constraint in executing the previous equation is of a physical nature and not of a logical one. This means r1 and r3 must be executed before execution of r2.

In a previous patent application, multi-valued gates and inverters were described to realize multi-valued two input/single output logic devices. See, for example, U.S. patent application Ser. No. 10/935,960, filed Sep. 8, 2004, entitled TERNARY AND MULTI-VALUE DIGITAL SCRAMBLERS, DESCRAMBLERS AND SEQUENCE GENERATORS, which is hereby incorporated by reference. A similar approach can be applied to the realization of binary logic functions.

Figure 1:
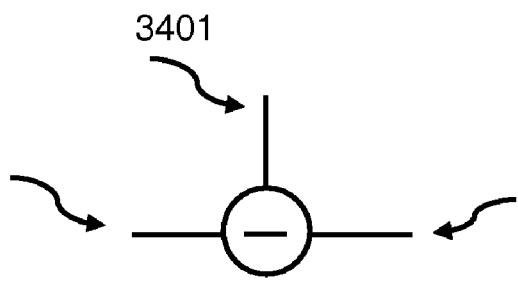
FIG. 1 illustrates a gate that conducts when its control input is 0.
Figure 2:
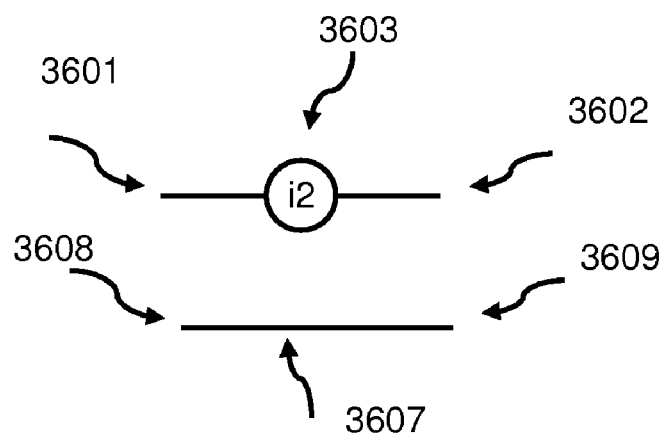
FIG. 2 illustrates a gate that conducts when the control input is 1.

All binary functions can be realized by applying an individually controlled gate as shown in FIG. 1 which is conducting when the control input 3401 has state 0 and is non-conducting when the state is 1 and one of two binary self-reversing inverters. A diagram of an inverter (3603) is shown in FIG. 2. A self-reversing binary inverter, being applied twice on a binary signal with either state 0 or state 1, will return the state of the signal to its original state. There are two binary self-reversing inverters. The first is the identity (the input is unchanged) and the second one is what would be considered the standard binary inverter, which inverts a binary state to its opposite state (e.g. a 0 into 1, and 1 into 0).

The truth table of the binary inverters i1 and i2 is shown in the following table.

|   | i1 | i2 |
|---|----|----|
| 0 | 0  | 1  |
| 1 | 1  | 0  |

The identity is shown as inverter i1 second column of the previous table. Inverter i2 is shown as the third column of the table.

The binary identity inverter i1 does not change a binary signal. The output (3609) of inverter i1 (3607) is identical to its input (3608). In a diagram the inverter i1 will be drawn as a straight uninterrupted line although it could also be represented as a i1.

The binary inverter i2 3603 with output 3602 has state 1 when the input 3601 has state 0 and has output 3602 in state 0 when input 3601 has state 1.

Figure 3:
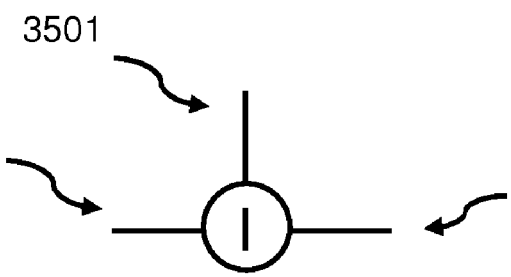
FIG. 3 illustrates a gate that conducts when its control input is 1.

The gate as shown in FIG. 3 is non-conducting when the individually enabled control input 3501 is 0. This gate is conducting when input 3501 has state 1.

Figure 4:
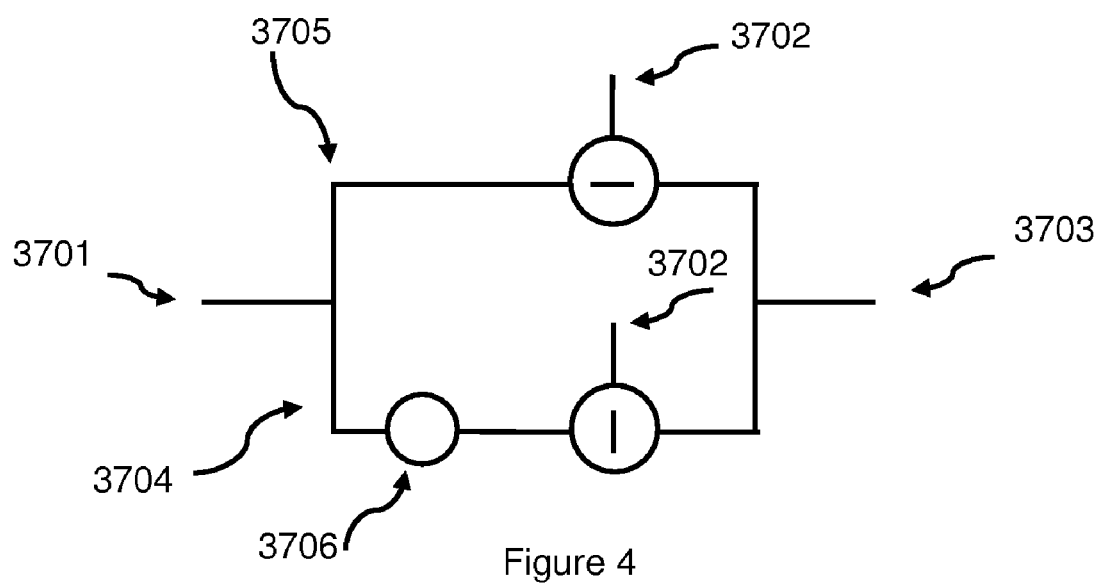
FIG. 4 illustrates a gate/inverter implementation of a binary XOR function.

The following table is the truth table of the binary XOR function, which is realized in the circuit of which a diagram is shown in FIG. 4.

|     |   | a |   |
|-----|---|---|---|
| XOR |   | 0 | 1 |
| B   | 0 | 0 | 1 |
|     | 1 | 1 | 0 |

The truth table is interpreted in the following way: if one of the two signals (say a) inputted to the logic device with the XOR truth table has state 0, then the other signal 'sees' a binary inverter as described by the column under the state 0 of the truth table. If the input signal a is in state 1, then the signal b 'sees' an inverter described by the column under the state 1 in the truth table.

The circuit in FIG. 4 realizes the function: s→a≠b with the truth table of the XOR function. Because the function is commutative it does not matter on which input signal 'a' occurs and on which one signal 'b'. For illustrative purposes it is assumed that signal 'a' is inputted at 3701. The signal 'b' is inputted at control inputs 3702 of the two gates. When signal 'b' has the state 0 the top branch 3705 will be conducting, and it will see inverter i1, or the identity. The bottom branch 3704 will be non-conducting. When the signal 'a' at input 3701 is 0 the output 3703 will also get the state 0. If 'a' is 1 the output will also be 1. When signal 'b' has state 1 the bottom branch 3704 will be in conducting state and 3705 will be non-conducting. The signal 'a' will then "see" the inverter 3706. When the signal 'a' is in state 0 the inverter will change the signal into a 1; when 'a' is 1 the inverter will change the signal 'a' into a 0. Thus FIG. 4 realizes the truth table of the XOR function. The circuit of FIG. 4 uses two different gates. Similar gates can be used, but inverters will have to be used in the control inputs so that the gates are enabled at different times.

The following table shows the truth table of the binary AND function.

| AND | a | |
|---|---|---|
| | 0 | 1 |
| b  0 | 0 | 0 |
| 1 | 0 | 1 |

When the input signal 'a' is 0 the signal 'b' 'sees' the all 0 column of the truth table. In case the input signal 'a' is 1, the signal 'b' sees the identity inverter as shown in the column below 'a' input value 1.

Figure 5:
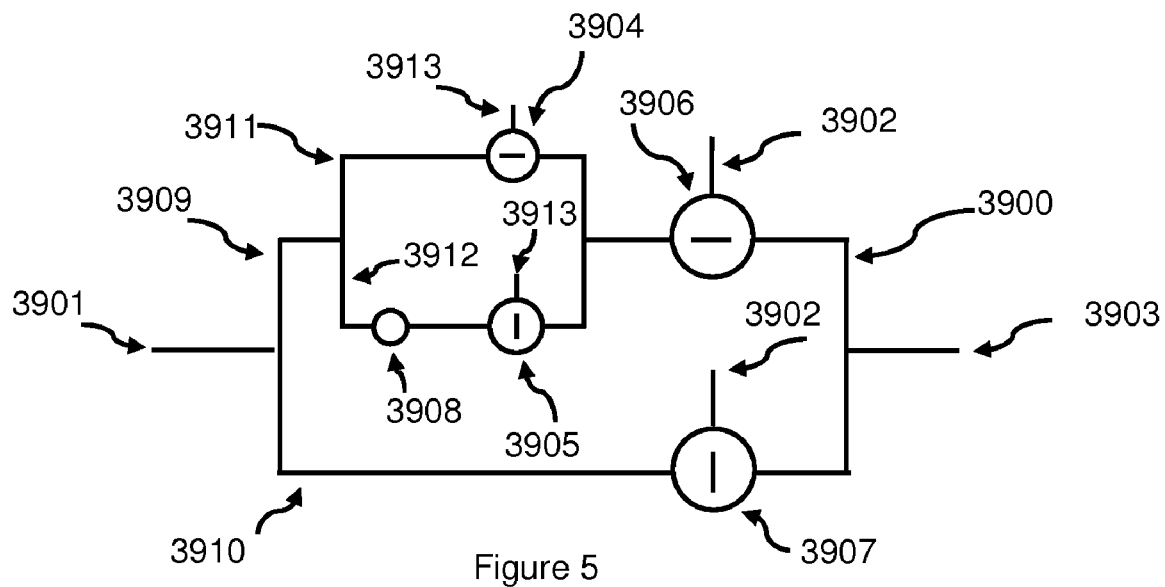
FIG. 5 illustrates a gate/inverter implementation of a binary AND function.

There are different ways to realize the AND function with gates and inverters. One embodiment is shown in FIG. 5. The circuit 3900 has two inputs: input 3901 and input 3902. The circuit 3900 also has one output 3903. The circuit also has two branches; the upper branch 3909 and the bottom branch 3910.

The bottom branch comprises the gate 3907, which is conducting when the input signal 3902 is 1. When gate 3907 is conducting the signal at input 3901 then 'sees' the identity inverter (not drawn, but it could be) and realizes the column of the truth table related to input signal 0.

The top branch 3909 comprises gate 3906, which is conducting when the signal at input 3902 is 0. When gate 3906 is conducting the signal coming from input 3901 'sees' two sub-branches', controlled by gates 3904 and 3905. Both of these gates are controlled by input 3913. When input 3913 is 0, then gate 3904 is conducting and 3905 is non-conducting. In that case the signal at output 3903 will have state 0. When the signal at 3913 is 1 while the signal at 3902 is 0, then branch 3912 will be conducting. The signal at 3901 will 'see' the inverter i2 at 3908 and its value will change from 1 to 0. Consequently the signal at output 3903 will have state 0. Consequently the top branch will realize the column of the truth table related to input signal has value 1. This approach is required when state 0 is NOT represented by 'absence of signal'. In the foregoing discussion, the signal a is applied on lines 3902 and the signal b is applied on lines 3913 and 3901. This order can, however, be reversed.

Figure 6:
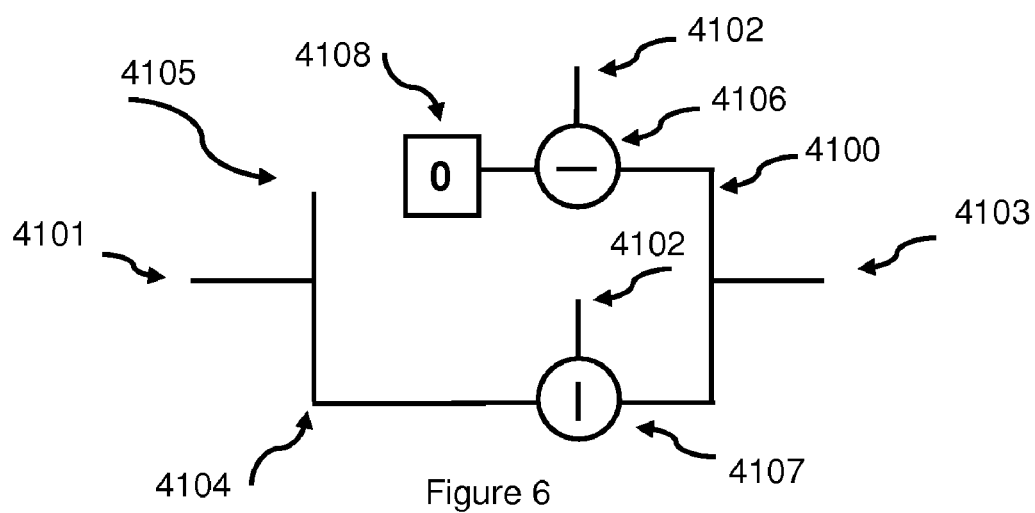
FIG. 6 illustrates another implementation of a binary AND function.

There is another way to realize the binary AND function as is shown in FIG. 6. The circuit 4100 has two inputs 4101 and 4102 and one output 4103. It comprises two branches: a top branch 4105 with a gate 4106 which is conducting when input 4102 has state 0 and gate 4107 which is conducting when input 4102 has state 1. In this case the top branch 4105 has been interrupted and, instead of the branch, a signal source 4108, always in state 0, is connected to the gate 4106. So when gate 4106 is conducting the output 4103 will assume the state 0. One of the signals (a or b) is applied to 4102 and the other signal (b or a) is applied to 4101. The order can be reversed.

Figure 7:
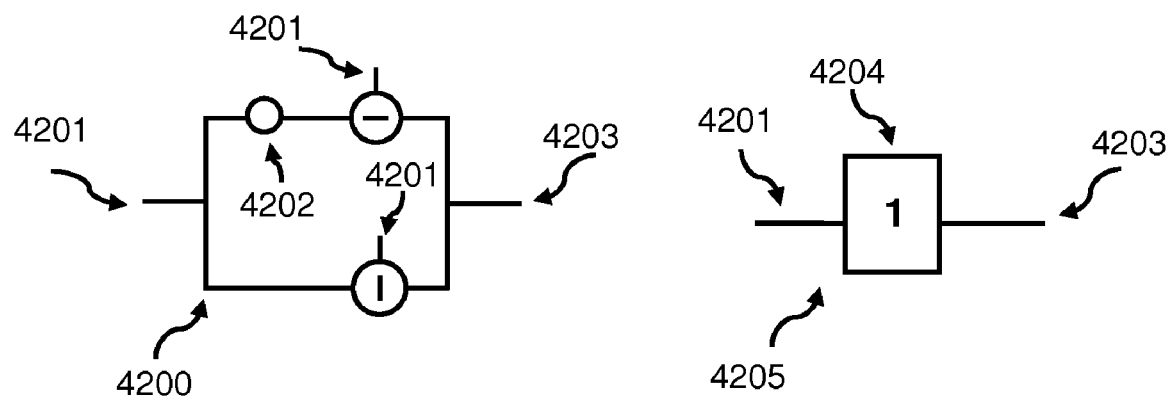
FIG. 7 illustrates an implementation of another binary function.

In a similar way part of a circuit, realizing a truth table consisting of all 1s can be realized as shown in FIG. 7. Circuit 4200 comprises two branches with gates, controlled by the input signal to the circuit. The top branch has an inverter 4202 which executes binary inverter i2. The gate in the top branch is conducting when the input signal has state 0. The inverter changes state 0 into state 1. The signal on output 4203 will assume the state 1. This circuit is equivalent to circuit 4205 comprising a source 4204 being always 1, an output 4203 which is always 1 and an input 4201 which can be 0 or 1. However the output 4203 does not depend on the input.

An important reason to avoid using inverters of type i2 is when the switching time (or propagation delay) of an inverter is significantly longer than the switching time of a gate. In that case it may be more beneficial to replace inverters with constant sources if possible.

It should be clear to those skilled in the art that states 0 and 1 do not really represent signals with physical values 0 or 1. They represent any two states. However it is possible to make state 0 representative of the physical situation of "no signal".

The use of 'absence of signal' as a logic state can have important consequences in creating logic devices.

Figure 8:
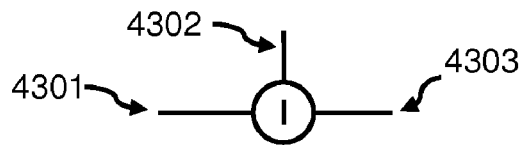
FIGS. 8 to 12 illustrate implementations of various binary functions.

FIG. 8 shows a diagram of a simple realization of the binary AND function with one gate. The circuit has an input 4301 and an output 4303. The gate 4304 is non-conducting when the control signal is 0 and conducting when the control signal is 1. The input 4301 is a signal 'b' and the control signal on 4302 is 'a'. The state 0 is represented by 'absence of signal'. It is clear that this circuit represents the AND function. When a=0 the gate 4304 is non-conducting and output 4302 has state 0 no matter what the input 'b' on 4301 is. When a=1 the gate 4304 is conducting and passes the signal 'b' ([0 1]) to the output.

Figure 9:
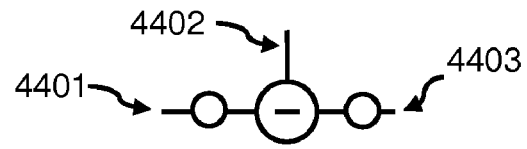

Similar approaches can be applied to other binary logic functions. FIG. 9 shows a diagram of the logic OR function when 'absence of signal' signifies a state 0. The a and b signals can be applied to either input 4401 or 4402. When the gate is not conducting, it outputs a 0 (if non-electronic gates such as mechanical or optical switches are used). If electronic gates are used, then high impedance output circuits should be used, as discussed later.

Figure 10:
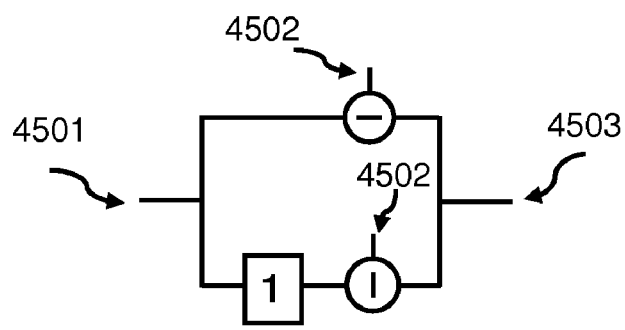

FIG. 10 shows a diagram of the logic OR function with no inverters. Again, the inputs a and b can be applied to inputs 4501 and 4502, respectively. Alternatively, these inputs can be switched.

Figure 11:
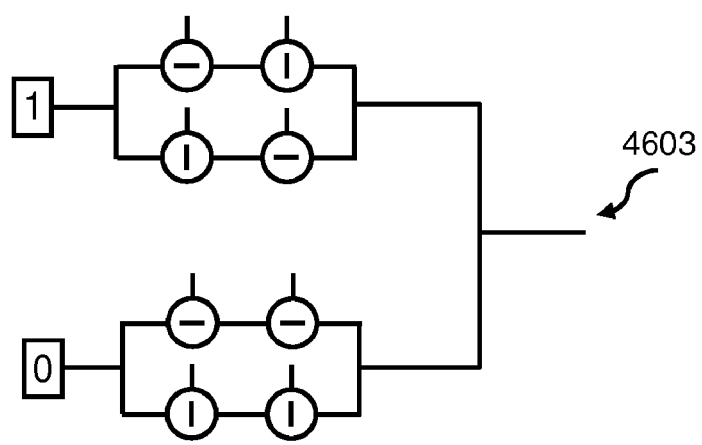
Figure 12:
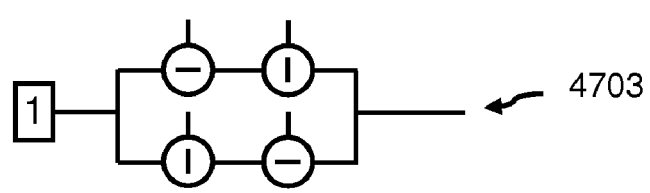
Figure 47:
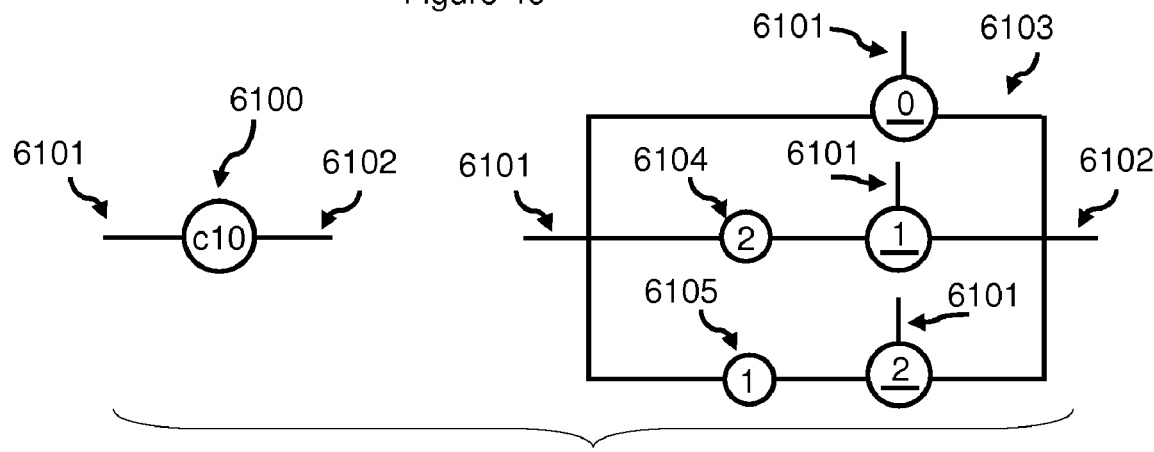

Yet another approach is to provide for each function the basic states 0 and 1 and use the relevant gates to switch the correct signal to the output. FIG. 11 shows the realization of the binary XOR function, by using gates and sources. In case 'absence of signal' signifies the state 0 the circuit as shown in FIG. 12 can be reduced to the circuit as shown in FIG. 47.

Composite Binary Circuits

In general digital binary circuits comprise more than one binary logic function. It is possible to design composite binary logic circuits with gates, controlled directly by the initial input signals from a logic expression without first calculating all end-states.

The following expression is an example of a composite logic expression: s→(a r1 b) r2 (c r3 d).

Figure 13:
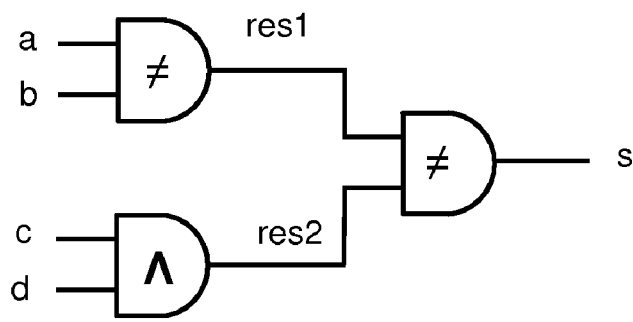
FIGS. 13 to 20 illustrate embodiments of the present invention to solve logic equations.

An example with binary logic functions is shown in FIG. 13. The expression describing the circuit is: s→(a≠b)≠(c∧d).

The completion of this expression first requires res1→ (a≠b) and res2→(c∧d) to be executed. Then the expression: s→res1≠res2 must be executed.

This is the common form of determining the result of the logic expression. However the signals a, b, c and d are all available at the start of calculating the expression. It is possible to speed up the execution of the expression by applying individually controlled gates.

Figure 14:
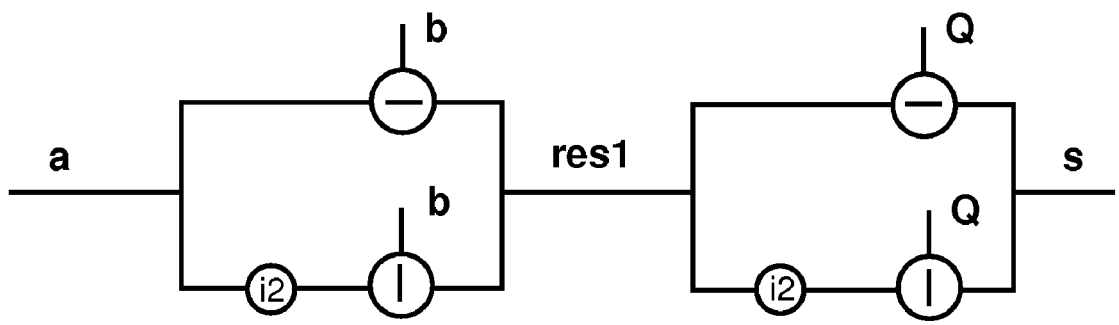

There are several ways to realize an expression by way of using gates controlled by the initial inputs (and not by intermediate results). As an example of one method, the expression: s→(a≠b)≠(c∧d) will be used. This expression can also be written as: s→res1≠Q. In which res1→(a≠b) and Q→(c∧d). The realization of the expression: s→(a≠b)≠Q is shown in FIG. 14.

Figure 15:
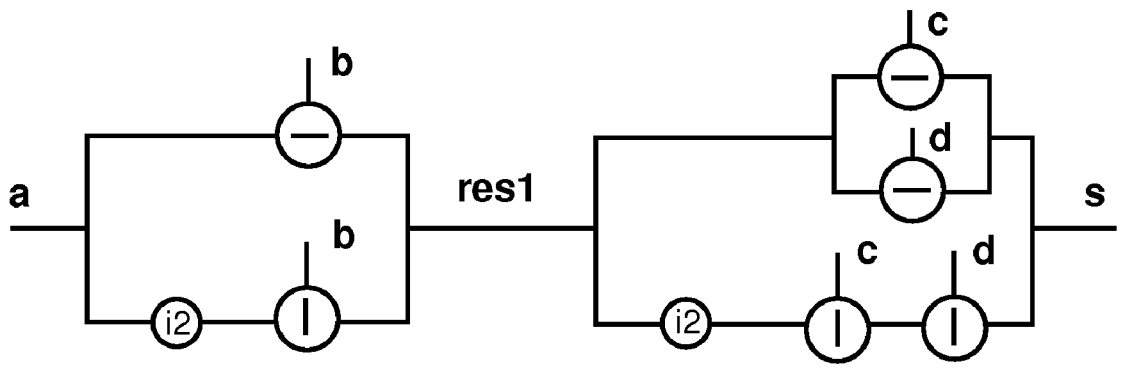

The method using gates and inverters applies two signals: an input signal that can be modified and a signal to control the gates. In that regard the expression: res1≠(c∧d) appears to pose problems, as it has three inputs. To resolve that issue the input Q→(c∧d) is created. Q=0 when (c∧d)=0. And Q=1 when (c∧d)=1. That means Q=0 when (c,d)=(0,0); (c,d)= (0,1) and (c,d)=(1,0). Q=1 for (c,d)=(1,1). The realization for this is shown in FIG. 15.

Another way of realizing the expression is by first rearranging the expression in the form: s→(((a r1 b) r2 c) r3 d) wherein r1, r2 and r3 are logic functions and a, b, c and d are logic inputs.

The significance of this expression is that each part of the expression within a set of parentheses is determined by two signals and has one output which can be the input to the next function.

In general the equation: s→(a r1 b) r2 (c r3 d) is not the same as: s→(((a r1 b)r2 c)r3 d). The known laws of logic have to be applied to find the equivalent expressions.

For the example the following equivalence applies: s→(a≠b)≠(c Ad)→(((c∧d)≠a)≠b).

Figure 16:
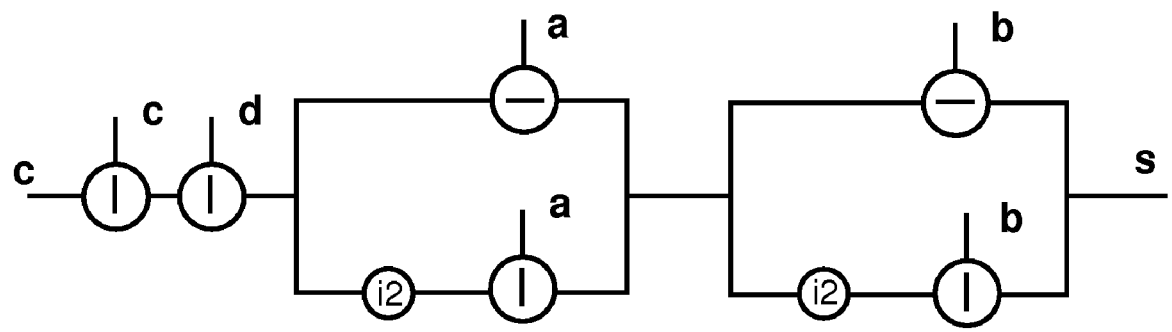

A possible realization of this expression is shown in a diagram in FIG. 16. For this solution it is assumed that the 'absence of signal' represents the state 0.

It should be clear to those skilled in the art that there are many ways to minimize the number of components in a possible realization. In order to make a circuit as fast as possible it is clear that one should minimize the number of 'slow' components in the critical path. The critical path can be made faster by changing serially connected critical elements into parallel branches.

The realization of binary digital circuits by applying gates that are enabled at virtually the same time allows for very fast execution of a composite binary logic expression.

Figure 18:
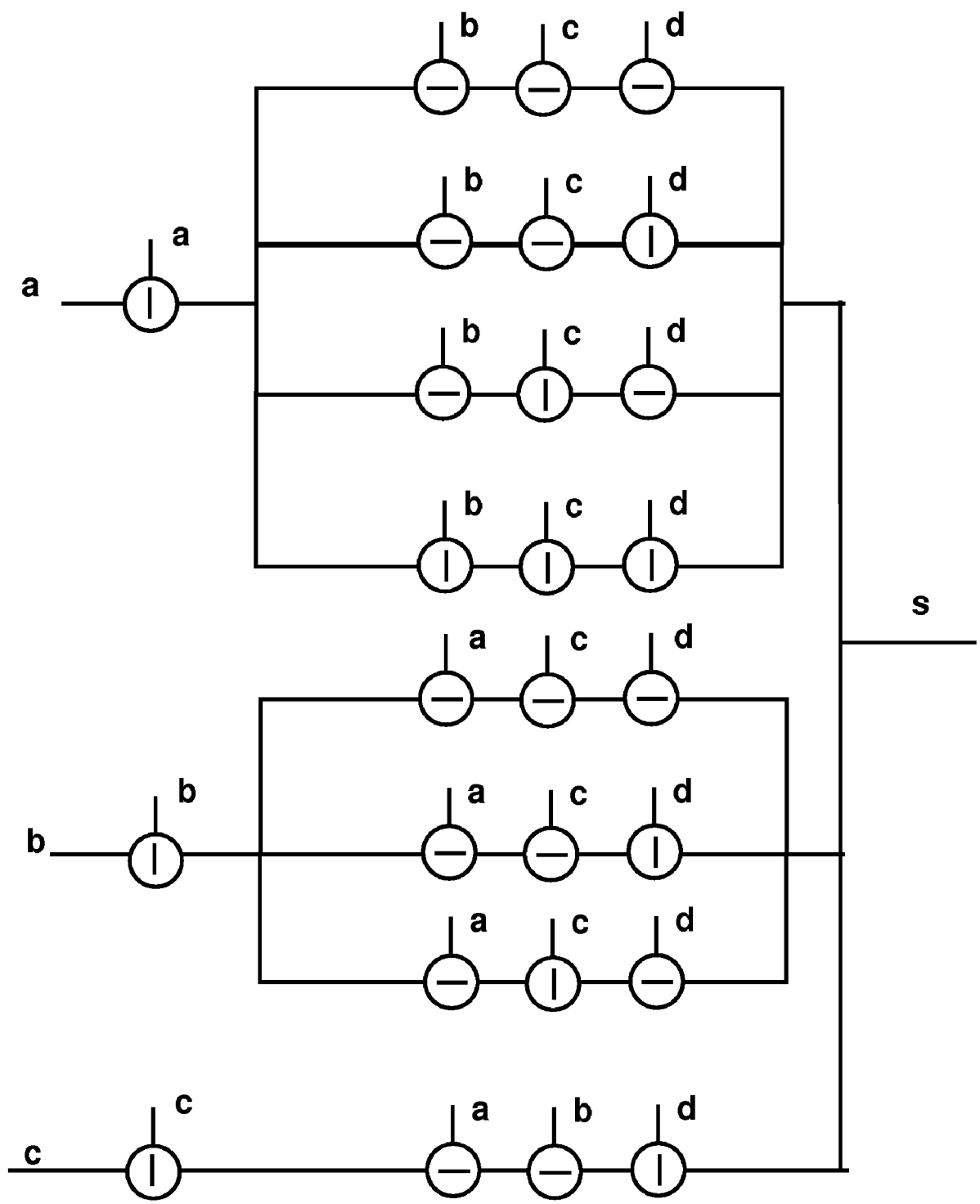

One can push the realization of a composite expression more into the direction of a lookup table realization by determining all input states and the related output states. In a hybrid form this approach can be used to circumvent the use of inverters. This is shown in FIG. 18 which shows the realization of the composite expression as realized in FIG. 16 by only using gates, assuming that 'absence of signal' represents state 0. The configuration of FIG. 18 is not minimized and only serves as a demonstration of how only gates gate be applied.

Figure 17:
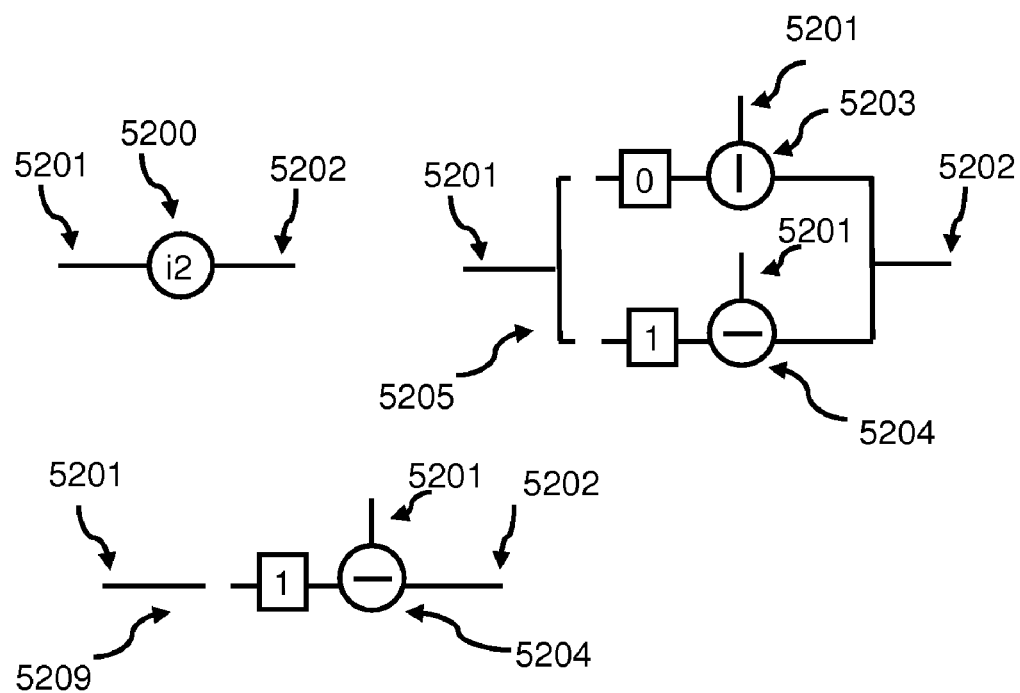

It is assumed in the previous circuits that an inverter switches faster than a gate. If that is not the case it may be advantageous to replace a binary inverter by two gates connected to constant source generators 0 and 1. This inverter replacement is shown in FIG. 17. The inverter 5200 has an input 5201 and an output 5202. When the signal on 5201 is 0 it will be inverted into a 1 on output 5202. When the input signal is 1 is will be inverted into a 0. The inverter can be replaced by a circuit 5205 with a top branch and a bottom branch. The top branch contains a gate 5203 which is controlled by the input signal on 5201. When the input signal is 1 the gate 5203 is conducting and the generated 0 will be put on the output 5202. When the 0 is represented by 'absence of signal' this branch can be omitted from the circuit. The bottom branch has a gate 5204 which is controlled by the signal on input 5201. The gate is conducting when 5201 has the signal 0. When the signal on 5201 is 0 the gate 5204 is conducting and the generated 1 is put on output 5202.

The configuration with state 0 represented by 'absence of signal' is shown as 5209 in FIG. 17.

Figure 19:
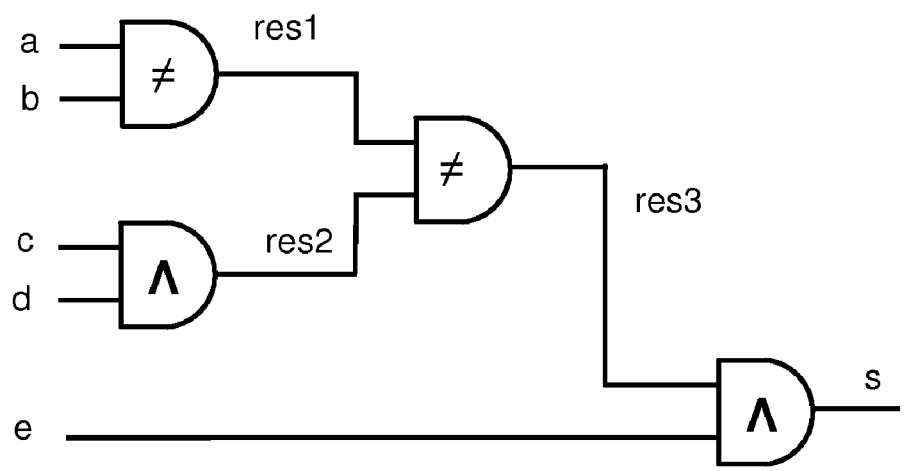

The advantage of the invented new approach becomes apparent in logic circuits containing more levels as for instance shown in FIG. 19. This circuit has three levels of devices. The logic signals have to propagate through each level before the next one can be executed. This adds to the total delay of execution.

Figure 20:
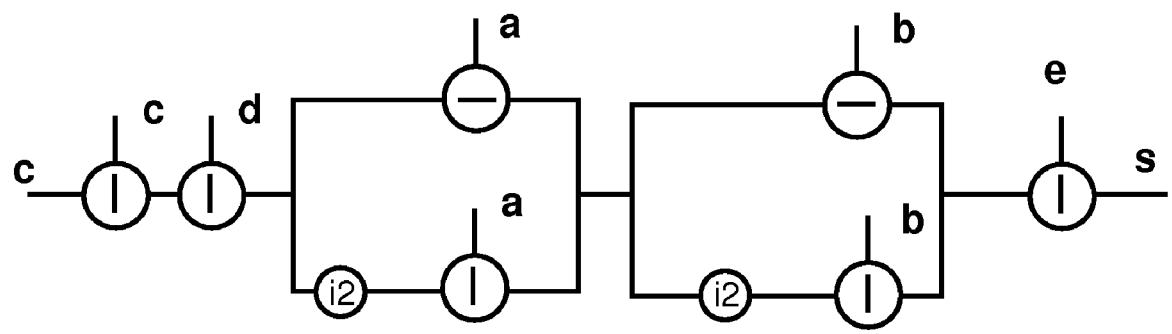

FIG. 20 shows a diagram of a realization applying gates and inverters. The invented approach assures that all gates are switched on or off at virtually the same moment. This means that as soon the input signals are available the actual signal has a 'clear road' ahead with limited propagation delays. The invention is logically not limited to any number of gates. The more levels of classical design it replaces, the more gain in speed will be achieved. The invention lends itself to different types of embodiments and can be applied to (but is not limited to) for example electrical and optical signals.

As stated before, inverter functions can be replaced by constant sources combined with the appropriate switching gates. The inverter needs to 'know' what its input is before it can operate on an incoming signal. Replacing an inverter with a constant source and gates that switch on initial conditions requires knowledge of the previous signal states and consequently will require more gates. It is desirable (in gates count) to put an inverter containing device as early in the chain as possible if it is required to replace an inverter by a constant source and gates.

The Method of Corrective Design.

The invention has as an additional benefit that it can correct or 'repair' faulty realizations of expressions. To those skilled in the art it is probably a familiar phenomenon that some realizations of an expression are almost correct, but fail to provide the correct output for some of the input states. Often it is the 'faulty' realization that provides a simpler and more desirable realization than the correct one. With the present invention it is relatively simple to use the 'faulty' realization and combine it with a corrective or 'repair' part. This is especially the case where the 0 state is represented by 'absence of signal' and wherein the 'faulty' realization generates a state 0, when it should be a state 1 in the correct realization. In that case the 'repair' state can just be added to the 'faulty' solution.

An illustrative example of this can be a 4 input binary expression which results in 16 possible output states. Assume that 2 of the 16 output states are incorrect, providing a state 0 while a state 1 is desired. If the state 0 is represented by 'absence of signal' it is relatively easy to add the two correct outputs.

As an example the expression: s→(a≠b)≠(c∧d) will be used. An attempt is made to realize the expression with the circuit shown in FIG. 21, which is the realization of: s1→(((a≠b)≠c)∧d). This circuit, with output signal s1, will fail to realize all output states of the above expression correctly. The output states of signal s1, the required correct output states s, and all input states for signals a, b, c and d are shown in the following table.

|    | s | s1 | a | b | c | D |
|----|---|----|---|---|---|---|
| 0  | 0 | 0  | 0 | 0 | 0 | 0 |
| 1  | 0 | 0  | 0 | 0 | 0 | 1 |
| 2  | 0 | 0  | 0 | 0 | 1 | 0 |
| 3  | 1 | 1  | 0 | 0 | 1 | 1 |
| 4  | 1 | 0  | 0 | 1 | 0 | 0 |
| 5  | 1 | 1  | 0 | 1 | 0 | 1 |
| 6  | 1 | 0  | 0 | 1 | 1 | 0 |
| 7  | 0 | 0  | 0 | 1 | 1 | 1 |
| 8  | 1 | 0  | 1 | 0 | 0 | 0 |
| 9  | 1 | 1  | 1 | 0 | 0 | 1 |
| 10 | 1 | 0  | 1 | 0 | 1 | 0 |
| 11 | 0 | 0  | 1 | 0 | 1 | 1 |
| 12 | 0 | 0  | 1 | 1 | 0 | 0 |
| 13 | 0 | 0  | 1 | 1 | 0 | 1 |
| 14 | 0 | 0  | 1 | 1 | 1 | 0 |
| 15 | 1 | 1  | 1 | 1 | 1 | 1 |

Figure 21:
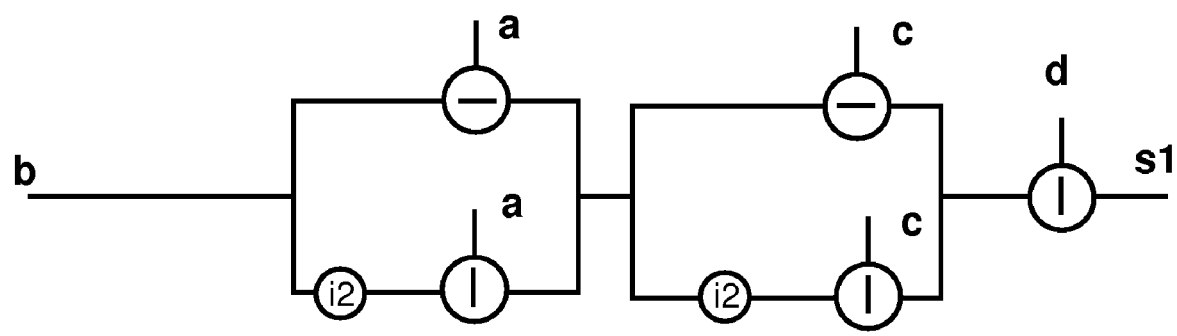
FIGS. 21 and 22 illustrate an aspect of the present invention related to corrective design.
Figure 22:
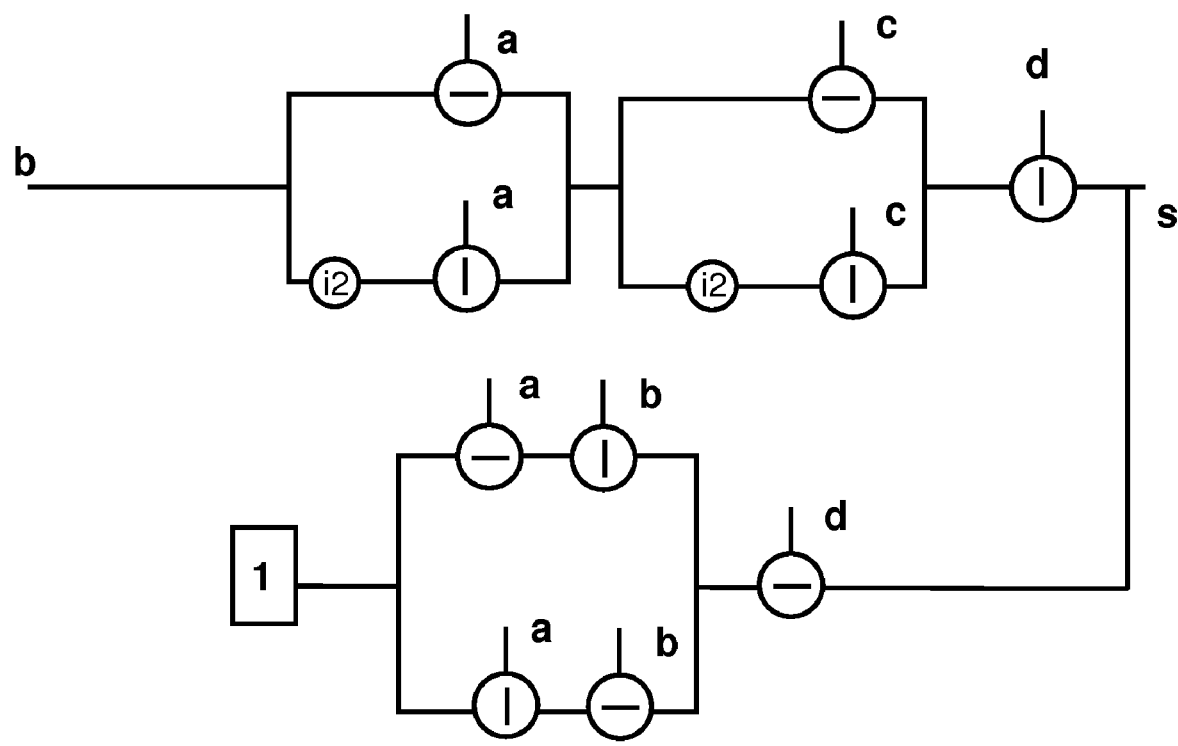
Figure 23:
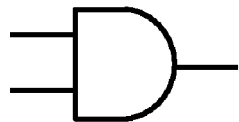
FIG. 23 is a diagram of a binary AND switch.
Figure 24:
FIG. 24 is a diagram of a binary NOT inverter.
Figure 25:
FIG. 25 is a diagram of a binary NAND switch.
Figure 26:
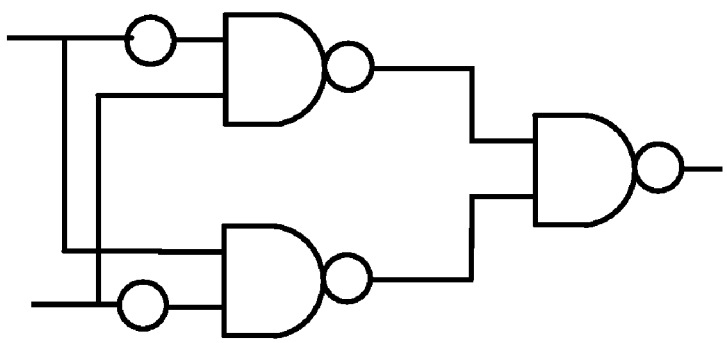
FIG. 26 is a diagram of a binary XOR switch.

From the table it can be concluded that signal s1 and s differ in the states 4, 6, 8 10. For the case where 'absence of signal' represents state 0, the output state 1 should be added (as a 'repair') to output s1, when input [a b c d]=[0 1 0 0], [a b c d]=[0 1 1 0], [a b c d]=[1 0 0 0] and when input [a b c d]=[1 0 1 0]. This 'repair' added to the diagram of FIG. 21 is shown in FIG. 22.

Ternary and N-Value Inverters.

The concept of ternary and n-value inverters has been introduced and applied in earlier U.S. patent applications Ser. Nos. 10/936,181 and 10/912,954. It will be explained briefly again here.

Ternary logic has three states, usually indicated by 3 consecutive numbers or values such as 0, 1 and 2. A state is just a label and no real numerical value should be assumed.

A ternary inverter is a one-place (or one operand) operation that transforms each of the three input ternary states into one of three output ternary states. The output state may be the same as or different from the input state. However the output states have values from the same set as the input states (0, 1 and 2 in this case).

Reversible ternary inverters are ternary inverters that allow the input states to be unambiguously determined from the output states and the inverter definition. The inverter is represented by a vector, showing the output results of the inversion of the input states [0 1 2]. The vector may be represented as a row or a column vector.

Self-reversing inverters are reversible inverters that will have as result the output vector [0 1 2] after being applied twice; once on the input vector [0 1 2] and again on the result of the inversion.

Ternary logic has 27 possible inverters and 6 reversible inverters. The ternary reversible inverters are shown in the following table:

| $i_1$ | $i_2$ | $i_3$ | $i_4$ | $i_5$ | $i_6$ |
|-------|-------|-------|-------|-------|-------|
| 0 | 0 | 0 | 1 | 1 | 2 | 2 |
| 1 | 1 | 2 | 0 | 2 | 0 | 1 |
| 2 | 2 | 1 | 2 | 0 | 1 | 0 |

Inverter $i_1$ is the identity inverter. Inverters $i_1$, $i_2$, $i_3$ and $i_6$ are self-reversing. Inverter $i_1$, $i_4$ and $i_5$ may be considered to be related. Executing inverter $i_4$ twice, is the same as executing inverter $i_5$ once. Executing $i_5$ twice is identical to executing $i_4$ once. And executing $i_4$ or $i_5$ three times will reverse all states back to identity and is identical to executing $i_1$. The inverters comprising $i_4$ and $i_5$ are called the 'universal inverters' as each of these inverters allows each input state to be transferred into any other output state.

A 4-value logic has 256 inverters of which 24 are reversible. It also has 3 universal inverters. And a n-value logic has $n^n$ inverters of which n! are reversible. N-value logic has (n-1) universal inverters.

The Ternary Logic Function.

The ternary truth table of a ternary logic function with two inputs and a single output will be used to realize a device executing the ternary logic function.

A ternary truth table has 3 columns and 3 rows. Each row and column has 3 elements. Each element describes the output of the function related to the truth table. For descriptive purposes a top row is added to indicate the value of one of the two inputs. A column to the left is added indicating the value of the second of the two inputs.

Figure 27:
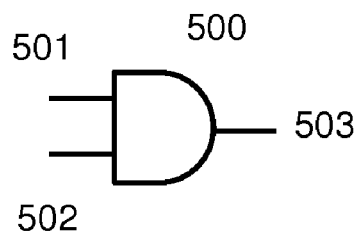
FIG. 27 is a diagram of a ternary logic switch and its truth table.

It is assumed that the ternary logic functions are non-commutative. This means that if the two inputs have different signal values it matters on which of the inputs a certain value is inputted. It is well known that binary logic functions can be represented symbolically, such as shown in FIGS. 23 to 26. Ternary (and higher value) logic functions (and devices) can also be represented symbolically. FIG. 27 shows an example of a symbolic representation of a ternary logic device (500) with a top input 501 and a bottom input 502 and an output 503. The ternary logic function 'ter' of this device is represented by the following truth table. Input 'a' corresponds with input 501 and input 'b' with input 502.

|     |   | a |   |   |
|-----|---|---|---|---|
| ter |   | 0 | 1 | 2 |
| b   | 0 | 0 | 1 | 2 |
|     | 1 | 2 | 0 | 1 |
|     | 2 | 1 | 2 | 0 |

The value of the input 'a' of the logic device determines the column in the truth table. The value of the bottom or 'b' input of a logic device determines the row in the truth table.

For illustrative purposes mainly the columns of truth tables will be considered for realization. For those skilled in the art it should be clear that columns and rows in that sense are interchangeable.

If the top input 501 of the ternary device 500 as shown in FIG. 27 is 0 the bottom input 502 'sees' as its transforming function the first column of ternary truth table 504. If the bottom input 502 has an input value 0 the output will have the state corresponding with the first element of the first column, being 0. If the bottom input 502 has the value 1 the output will assume the value of the second element of the first column, being 2.

If the top input 501 of the ternary device 500 in FIG. 27 is 1, the bottom input 502 'sees' as its transforming function the second column of the ternary truth table 504.

If the top input 501 of the ternary device 500 in FIG. 27 is 2, the bottom input 502 'sees' as its transforming function the third column of the ternary truth table 504. A possible way to look at a ternary logic function described by a ternary truth table is to consider the truth table to be assembled from three inverters (representing by the individual columns). The ternary inverters are devices that have to be connected through a gating mechanism in such a way that depending on the top input to the ternary function one of the three inverters becomes the operational one.

Figure 28:
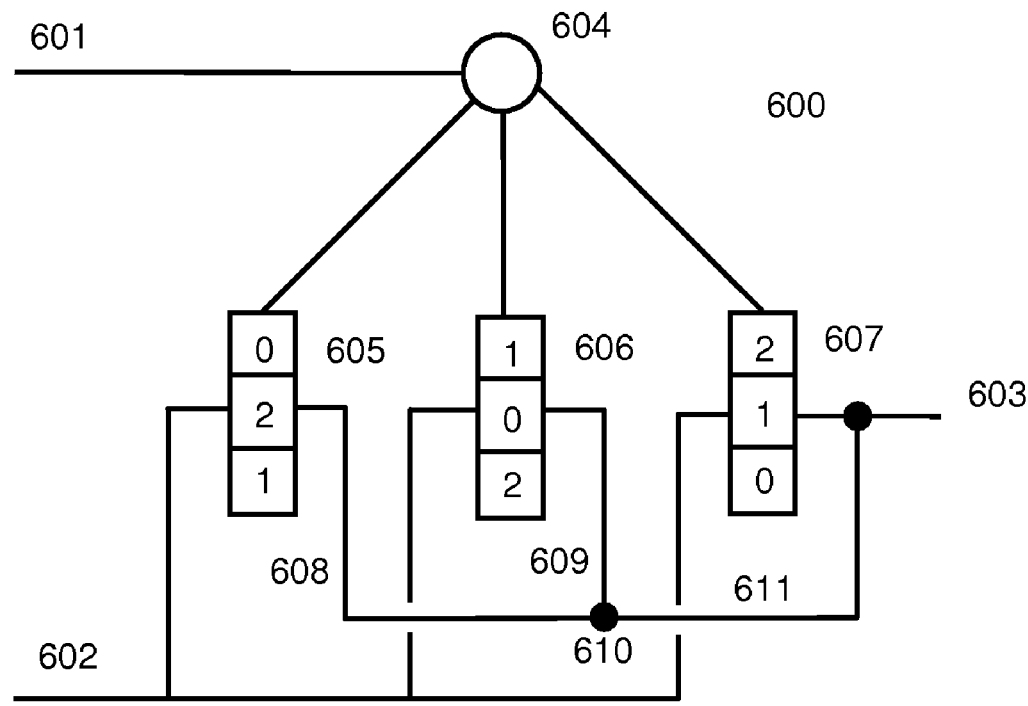
FIG. 28 is a diagram of a realization of the ternary switch as shown in FIG. 23.

This principle is demonstrated in FIG. 28. It shows a diagram of a ternary device 600 with two inputs 601 and 602 and an output 603. The top input 601 is connected to a special gate 604 with three outputs. The assumption on gate 604 is that it activates inverter 605 if the input 601 has the value 0, or the inverter 606 if the input 601 has value 1, or it activates inverter 607 if the input 601 has the value 2. If an inverter is not activated its output has always a physical output of value zero (no signal). Further more the input 602 of the device is connected to the individual inputs of the inverters 605, 606 and 607. Only the inverter that is activated will have a physical output signal not equal to zero. The activated inverter will invert the logical state of the signal at input 602. The physical output 608 of inverter 605 and the physical output of inverter 606 are collected at point 610 in a signal 611. Signal 611 is combined with the output of inverter 607 into output signal 603, keeping in mind that just one inverter can be activated at each given moment and can have a physical output not equal to zero. Consequently the output as generated at output 603 is equal to the output of a ternary device as shown in FIG. 5 with its depicted truth table.

Figure 29:
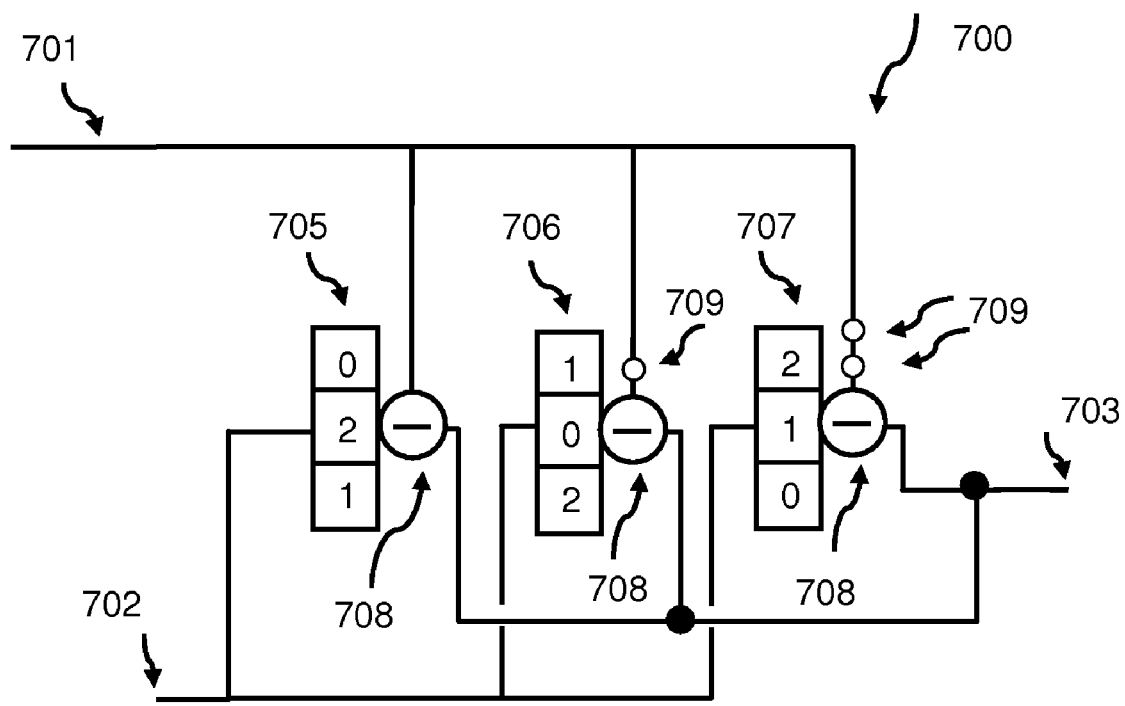
FIG. 29 is a diagram of a realization of a ternary switch applying gates and inverters.

Another realization of the device in FIG. 28 is shown in FIG. 29.

The diagram of FIG. 29 shows the realization of the same truth table as the device of FIG. 28. The device 700 in FIG. 29 has top input 701, bottom input 702 and output 703. It has three ternary inverters 705, 706 and 707 which are identical to the inverters 605, 606 and 607 in FIG. 28. All inverters in FIG. 29 have the signal on input 702 as their individual inputs. Each inverter output is connected to a gate designated 708, 709 and 710. These gates are conducting when its control signal is 0. It is non-conducting when the control signal is not 0. The gate 708 at the output of inverter 705 is controlled by the ternary signal at input 701. When the ternary signal at input 701 has value 0, then the gate 708 at the output of inverter 705 is conducting and the result of the inversion of signal 702 by inverter 705 is conducted to output 703.

The gate 708 at the output of inverter 706 has a ternary universal inverter i5 709 (which will be explained later) in its control input path. The signal from input 701 will first be inverted by inverter i5 709 before it reaches the control input of gate 709 at the output of inverter 706. The inverter i5 transforms input [0 1 2] to the states [2 0 1], or state 0 to state 2, state 1 to state 0 and state 2 to state 1. Consequently if the input signal to 701 is 0 then the control signal to gate 709 at the output of inverter 706 is 2, and the gate is non-conducting. When the signal to the input 701 is 1 then the control signal to gate 709 at inverter 706 is 0 and then the gate is conducting.

The gate 708 at the output of inverter 707 has two universal inverters i5 in its control input path. Applying two inverters is 712 and 713 consecutively will transform an input [0 1 2] to output [1 2 0]. This means that the gate 710 at the output of inverter 707 is only conducting when the input signal at input 701 is 2.

Consequently only one of the outputs of the three inverters 705, 706 and 707 will be active and determine the output signal at 703 thus realizing the ternary truth table of FIG. 5.

Types of Control-Input Ternary Gates.

Figure 30:
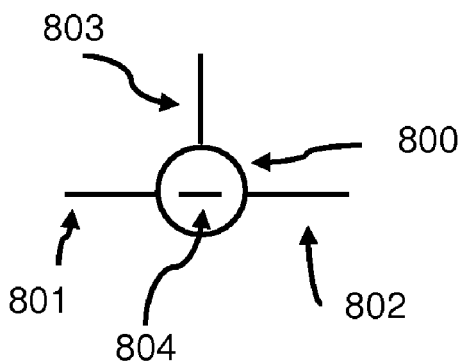
FIG. 30 is a diagram of a gate that conducts when the control input state is 0.

In accordance with one embodiment of the present invention there are at least two physical types of conducting and non-conducting gates. The first has already been applied in the device as shown in FIG. 29. A diagram of this gate is shown in FIG. 30. This gate 800 has a control input 803. It has a signal input 801 and a signal output 802. The gate 800 is conducting a signal from input 801 to output 802 when the signal at control input 803 is 0 and is non-conducting when the control input is not 0. The horizontal line 804 indicates it is conducting for a control input value 0.

Figure 31:
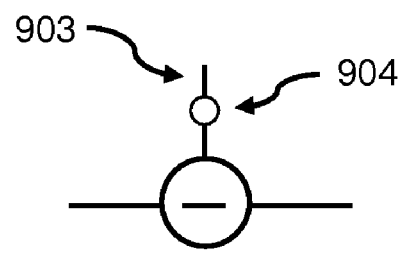
FIG. 31 is a diagram of a conducting/non-conducting switch with an inverter in its control input that conducts when the control input state is 0.

Another approach in accordance with an aspect of the present invention is to create a gate that is conducting for control values other than 0 in a ternary and multi-value setting. This can be achieved by putting universal inverters in the control input of a gate. This is shown in FIG. 31. A universal inverter 904 is inserted in the control input 903 of the gate. If the inverter is equivalent to ternary inverter i5 then control input value 0 is transformed to state 2. So the gate will not conduct for an input value 0 to the input 903 (because it is changed to value 2. For control input signal 2 the gate is non-conducting). The gate will now become conducting when the control input signal to 903 has the value 1. The value 1 will be transformed to value 0 by the inverter and the gate will conduct. In that configuration the gate will also not conduct for a control input value of 2. The inverter will change the control value 2 to 1, and the gate will be non-conducting.

The gate can be made conducting for a control input value 2 by inserting the inverter i4 at position 904. The inverter will transform 2 to 0. This can also be achieved by inserting two serial connected inverters i5 in position 904 of the control input of the gate.

Thus it is possible to create a gate that is conducting for each one of 3 states in ternary logic, but be non-conducting for the two other states. (or conducting for 0, not for 1 and 2; conducting for 1, not for 0 and 2; conducting for 2 not for 0 and 1). This can be achieved by applying single inverters or a multiple of identical inverters.

Figure 32:
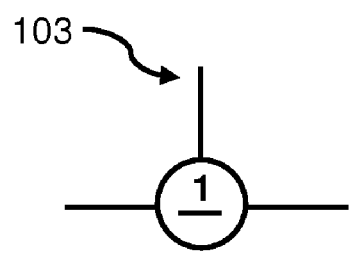
FIG. 32 is a diagram of a gate that is switched into conducting state by a control input in state 1.

Since it is possible to create the different conducting gates, it is no longer necessary to draw the individual inverters in the control input. For design purposes it is sufficient to draw a gate as shown in FIG. 32. The gate is drawn as a circle with input and output and a control input. The circle has a horizontal line with a number on top. This means that this gate is conducting for a control input value equal to that number, in FIG. 32 that value is 1. The gate is non-conducting for all other control values. In the gate of FIG. 10 that gate is non-conducting for control input values other than 1.

Figure 33:
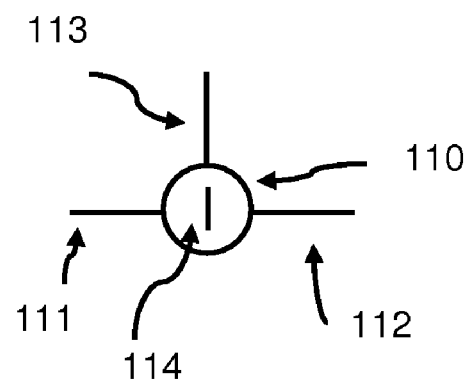
FIG. 33 is a diagram of a gate that is non-conducting when the control input state is 0.

A different type of known conducting and non-conducting gates is formed by gates that are non-conducting for control input value is 0 and which is conducting for all other values of the control input. Such a type of gate is shown in FIG. 33. The gate 110 has an input 111, an output 112 and a control input 113. The vertical line 114 indicates that this gate is non-conducting for control input value 0. Such a gate can be realized from the gate of FIG. 30 by applying an inverter to the control input of the gate of FIG. 30. The inverter would transform all non-0 inputs to a 0 and a 0 input to a non-zero result.

A new approach is to create a gate that is non-conducting for control values other than 0 in a ternary and multi-value setting. This can be achieved by putting universal inverters in the control input of a gate. This is shown in FIG. 12. A universal inverter 124 is inserted in the control input 1233 of the gate. If the inverter is equivalent to ternary inverter i5 then control input value 0 is transformed to state 2. So the gate will conduct for an input value 0 to the input 123 (because it is changed to value 2. For control input signal 2 the gate is conducting). The gate will become non-conducting when the control input signal to 123 has the value 1. The value 1 will be transformed to value 0 by the inverter and the gate will not conduct. In that configuration the gate will conduct for a control input value of 2. The inverter will change the control value 2 to 1, and the gate will be conducting.

Figure 35:
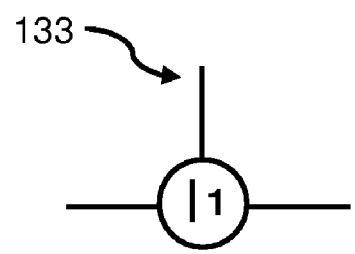
FIG. 35 is a diagram of a gate that is switched into non-conducting state by a control input in state 1.

Since it is possible to create the different non-conducting gates, it is no longer necessary to draw the individual inverters in the control input. For design purposes it is sufficient to draw a gate as shown in FIG. 35. The gate is drawn as a circle with input and output and a control input. The circle has a vertical line with a number to its right. This means that this gate is non-conducting for a control input value equal to that number, in FIG. 35 that value is 1. The gate is conducting for all other control values. In the gate of FIG. 35 that gate is conducting for control input values other than 1.

4-Value and n-Value Conducting and Non-Conducting Gates.

The same reasoning as applied in the ternary case can be applied to 4-value conducting and non-conducting gates. For 4-value logic all different conducting gates can be realized with a conducting gate for control input is 0 and 3 4-value universal inverters. This can also be achieved with a conducting gate for control input is 0 and applying one universal inverter once, twice and three times to create the appropriate control input states. The same applies to the non-conducting 4-value gates.

The same applies for n-value logic. In that case (n-1) universal inverters are required or one universal n-value inverter should be applied up to (n-1) times to create all the required control input values.

Other Gate Configurations.

The n-value gates so far have a common characteristic: they are individually controlled by a single input value, and as a result for a certain control state the gate is conducting or non-conducting. FIG. 32 shows a gate which is conducting when the control input is 1. This can be achieved by putting an inverter at the control input which transforms input state 1 into state 0. So when the gate is conducting when its individual control input has state 0, now makes sure that this only happens when the input signal has state 1 and is transformed by an inverter into state 0.

As an illustrative example this inverter in the ternary case can be the universal inverter [2 0 1]. This inverter meets the criteria that (a) the state 1 is transformed into state 0 and (b) all other states will not be transferred into state 0 (and the gate remains non-conducting).

There are of course other inverters that will achieve that result. These inverters have the form [x 0 y]. The values of x and y can be 1 or 2 but cannot be 0 if the inverter is used to make a gate conducting for control input is 1.

Figure 34:
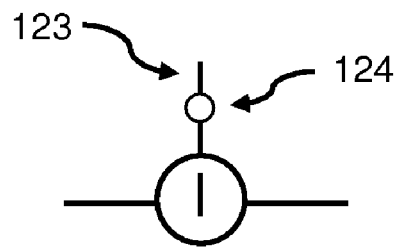
FIG. 34 is a diagram of a conducting/non-conducting switch with an inverter in its control input that is non-conducting when the control input state is 0.

The gate can also be made of a non-conducting configuration when control input is 0 as is shown in FIG. 34. FIG. 35 shows a configuration of a gate that is non-conducting when the control input is 1. This can be achieved by putting an inverter in the control input of a non-conducting gate that transforms input 1 into 0. This is shown in FIG. 35. The inverter can again be the universal inverter [2 0 1] or any other inverter [x 0 y] with x and y being 1 or 2 but not 0 (examples: [1 0 1] or [1 0 2]. So in case an inverter [x 0 y] is used in the input of a gate that is non-conducting for the individual control signal is 0, the gate will be conducting for the signal on the input on the inverter on the control input of the gate is either 0 or 2.

It should be clear that one can also use inverters to achieve the non-conducting results with a gate that is conducting when the control input is 0. This can be done by inserting an inverter that creates the state 0 for different inputs. For instance the inverter [0 1 0] will transform state 0 and 2 into state 0 and will leave state 1 unchanged. The inverter [0 1 0] inserted in the input of the gate that is conducting for control signal is 0 will make the gate non-conducting for control signal to the inverter is equal to 1.

Other n-Value Gates.

The same principles apply to higher values for n, such as n=4 or n=5. By applying inverters one can make a 4-value gate conducting for 2 of the 4 states. For instance assume that a gate is available that is conducting for control input is 0. The requirement is that the gate is conducting for inputs 2 and 3 (out of possible states 0, 1, 2 and 3). This can be achieved by inserting for example the inverter [1 2 0 0] into the control input of the conducting gate. Another way, if only universal inverters are available, is to use two gates of which one has at its control input [2 3 0 1] and the other has [1 2 3 0].

Consequently it is possible to create n-value solutions where a signal can be conducted for any p out of n possible control states (and p<n) or where a signal can be blocked from passing for any p out of n possible control states.

Illustrative Ternary Logic Devices.

There are many ways to realize ternary devices with the gates and inverters here described. Some differences in realizing a single device may occur. These differences may occur because of design preferences, choice of gates and inverters and availability of gates and inverters.

All ternary truth tables can be realized by using (in unlimited amounts) the original gate that conducts when the control input is zero and one ternary universal inverter.

It will be shown (in strictly illustrative and non-limiting examples) how different configurations can realize the same ternary function.

Figure 36:
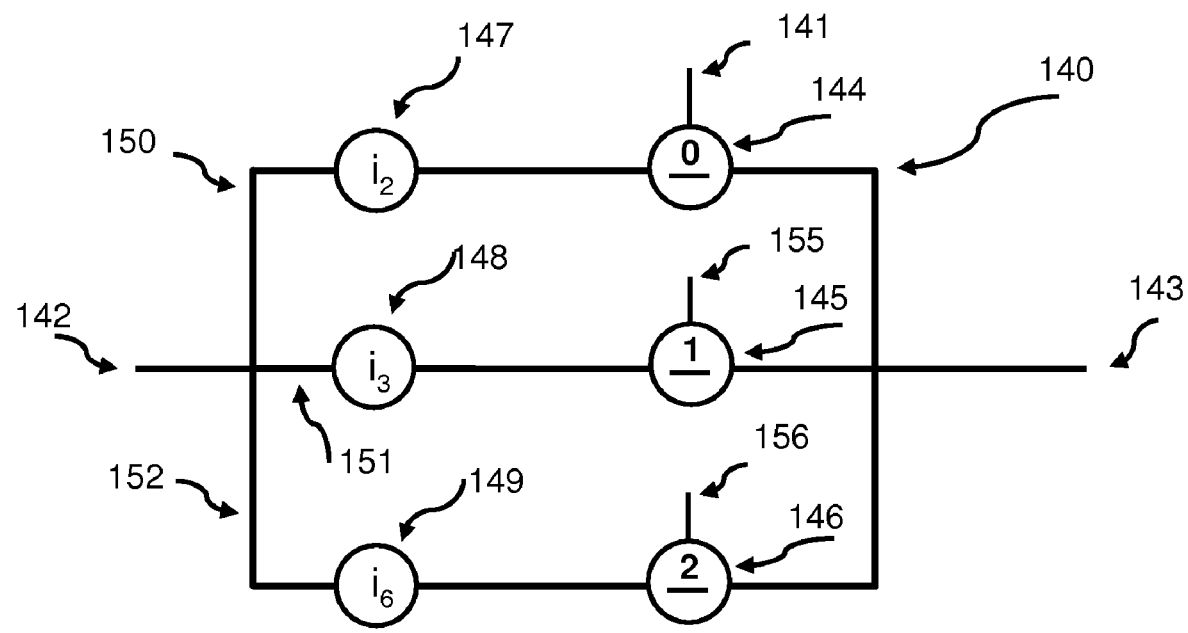
FIG. 36 is a diagram showing a realization of a ternary logic function by applying gates and inverters.

The device 140 shown in FIG. 36 realizes the ternary truth table of the earlier defined ternary logic function 'ter' with the following truth table.

|     |   | a |   |   |
|-----|---|---|---|---|
| ter |   | 0 | 1 | 2 |
| b   | 0 | 0 | 1 | 2 |
|     | 1 | 2 | 0 | 1 |
|     | 2 | 1 | 2 | 0 |

The control inputs 141 to the gates 144, 145 and 146 of device 140 have the input signal at input 501 of device 500 in FIG. 27 to control inputs 141, 145 and 146. The input 142 of device 1400 has the signal at input 502 of device 500 in FIG. 27. The signal at output 143 of device 1400 corresponds with output 503 of device 500 in FIG. 27.

The device 140 of FIG. 36 has 3 channels or circuits 150, 151 and 152. Each channel connects the input 142 with output 143. The conductance state of each channel is controlled by a gate. The conductance of channel 150 is controlled by gate 144 with control input 141. The conductance of channel 151 is controlled by gate 145 with control input 155 and the conductance of channel 152 is controlled by gate 146 with control input 156. In conformance with previously described rule the gate 144 is conducting when the control input 141 has value 0. The gate 145 is conducting when the control input 155 has value 1. The gate 146 is conducting when the control input 156 has value 2.

Channel 150 has an inverter 147, representing ternary inverter i2 as described in the ternary inverter table. This means that when gate 144 is in conducting state the ternary signal inputted to input 142 will be inverted by inverter i3 and outputted to output 143. All other gates will not conduct and only the signal through channel 150 will contribute to the output signal.

Channel 151 has an inverter 148, representing ternary inverter i3 as described in the ternary inverter table. This means that when gate 145 is in conducting state the ternary signal inputted to input 142 will be inverted by inverter i3 and outputted to output 143. All other gates will not conduct and only the signal through channel 151 will contribute to the output signal.

Channel 152 has an inverter 149, representing ternary inverter i6 as described in the ternary inverter table. This means that when gate 146 is in conducting state the ternary signal inputted to input 142 will be inverted by inverter i6 and outputted to output 143. All other gates will not conduct and only the signal through channel 152 will contribute to the output signal.

Consequently each channel realizes a column of the ternary truth table of ternary function 'ter'. Inverter i2 is identical to column one of truth table 504, inverter i3 is identical to column 2 of the truth table 504 and inverter i6 is identical to column 3 of the truth table 504.

Figure 37:
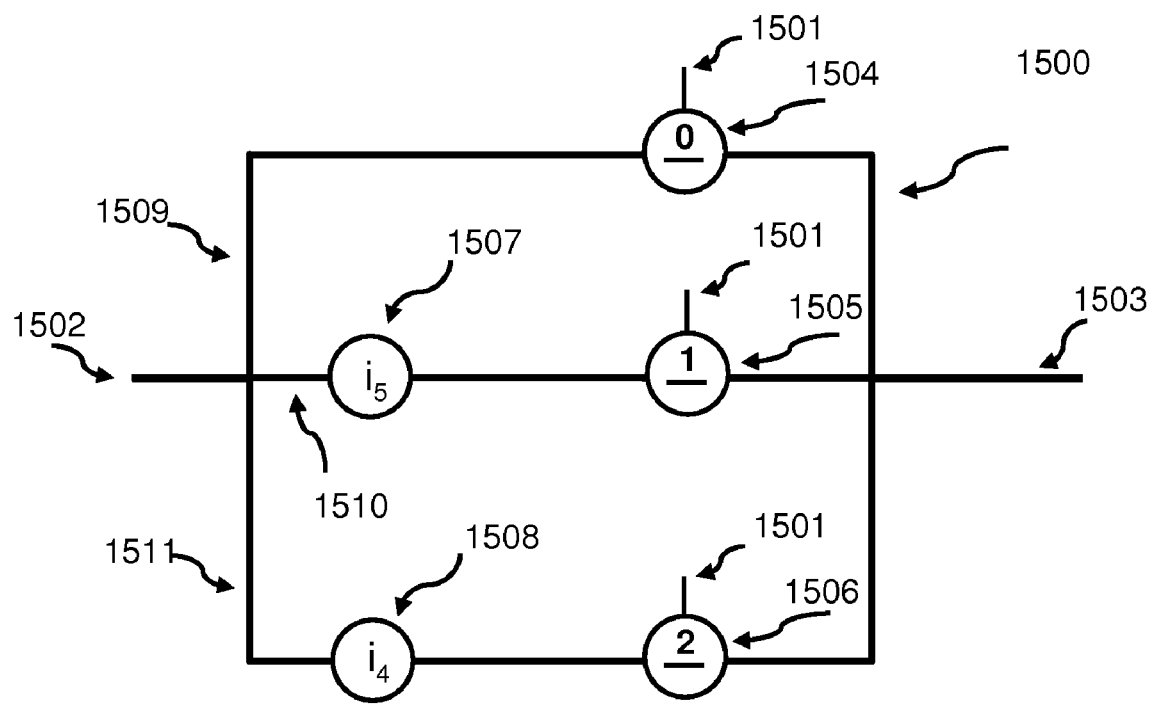
FIG. 37 is a diagram showing a realization of a ternary logic function by applying gates and inverters.

FIG. 37 shows a diagram of a different way to realize the truth table 504 in accordance with another aspect of the present invention. In this case the control inputs 1501 to the gates 1504, 1505 and 1506 in device 1500 in FIG. 15 correspond with input 502 to device 500 in FIG. 5. The input 1502 corresponds to input 501 to device 500 in FIG. 5.

Following the same reasoning as in regards to FIG. 36 it is clear that channel 1509, which now has no signal inverter, realizes the first row of ternary truth table 504 of FIG. 5. Channel 1510 with inverter 1507 representing ternary inverter is, realizes the second row of that ternary truth table and channel 1511 with inverter 1508 representing ternary inverter i4, realizes the third row of the ternary truth table 504 of FIG. 5.

Consequently the device of FIG. 37 realizes the same function as the device of FIG. 36 but with a fewer number of components and by only applying universal inverters.

Figure 38:
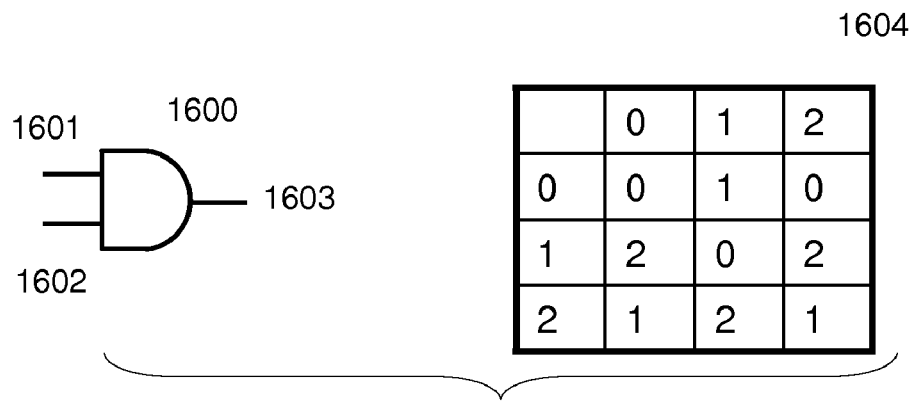
FIG. 38 is a diagram of a ternary logic device with its truth table.

FIG. 38 shows a diagram of a ternary logic function 1600 with the following truth table.

|  |  | a |  |  |
|---|---|---|---|---|
| ter |  | 0 | 1 | 2 |
| b | 0 | 0 | 1 | 0 |
|  | 1 | 2 | 0 | 2 |
|  | 2 | 1 | 2 | 1 |

Figure 39:
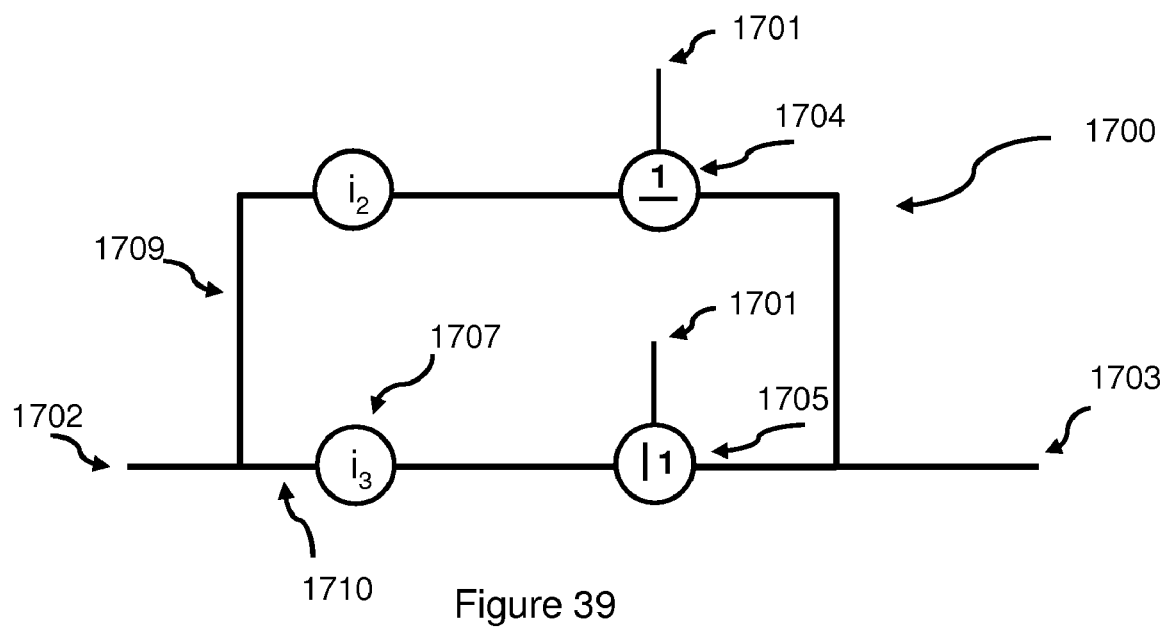
FIG. 39 is a diagram showing a realization of a ternary logic function by applying gates and inverters.

This function can be realized in the device of which a diagram is shown in FIG. 39. The input 1601 of device 1600 corresponds with control inputs 1701 to the gates 1704 and 1705 of device 1700. Input 1602 corresponds with input 1702 of device 1700.

The first and third columns in the truth table 1604 are identical. Thus it is possible to reduce the number of components in device 1700. Channel 1710 in device 1700 conducts a signal from input 1702 to output 1703 when the gate 1706 is conducting. Gate 1706 is non-conducting for control input 1701 is 1, thus it is conducting when its control input is not 1 but 0 or 2.

Illustrative 4-Value Devices.

The principles of the present invention—realizing multi-value logic functions with gates and inverters—can be applied to all multi-value systems. For illustrative purposes only several examples of realizing 4-value logic devices with gates and inverters will be provided.

The gates applied will be of the same type as in the ternary case. This includes one type of gate that has a control input and which is conducting when the control input has a value 0 and is non-conducting for any other input value. It also includes a type of gate that is non-conducting if the control input is 0 and it is conducting for all other values of the control input.

Other components may include any of the 254 4-value inverters. The inverter [0 0 0 0] is an open connection. The inverter [0 1 2 3] (or identity) is a closed connection.

A 4-value logic has 24 reversible inverters, shown in the following table:

| $i_1$ | $i_2$ | $i_3$ | $i_4$ | $i_5$ | $i_6$ | $i_7$ | $i_8$ | $i_9$ | $i_{10}$ | $i_{11}$ | $i_{12}$ | $i_{13}$ | $i_{14}$ | $i_{15}$ | $i_{16}$ | $i_{17}$ | $i_{18}$ | $i_{19}$ | $i_{20}$ | $i_{21}$ | $i_{22}$ | $i_{23}$ | $i_{24}$ |
|---|---|---|---|---|---|---|---|---|---|---|---|---|---|---|---|---|---|---|---|---|---|---|---|
| 0 | 0 | 0 | 0 | 0 | 0 | 0 | 1 | 1 | 1 | 1 | 1 | 1 | 2 | 2 | 2 | 2 | 2 | 2 | 3 | 3 | 3 | 3 | 3 |
| 1 | 1 | 1 | 2 | 2 | 3 | 3 | 0 | 0 | 2 | 2 | 3 | 3 | 0 | 0 | 1 | 1 | 3 | 3 | 0 | 0 | 1 | 1 | 2 |
| 2 | 2 | 3 | 1 | 3 | 1 | 2 | 2 | 3 | 0 | 3 | 0 | 2 | 1 | 3 | 0 | 3 | 0 | 1 | 1 | 2 | 0 | 2 | 0 | 1 |
| 3 | 3 | 2 | 3 | 1 | 2 | 1 | 3 | 2 | 3 | 0 | 2 | 0 | 3 | 1 | 3 | 0 | 1 | 0 | 2 | 1 | 2 | 0 | 1 | 0 |

Of these reversible inverters i10, i17 and i19 are the 4-value universal inverters.

Figure 40:
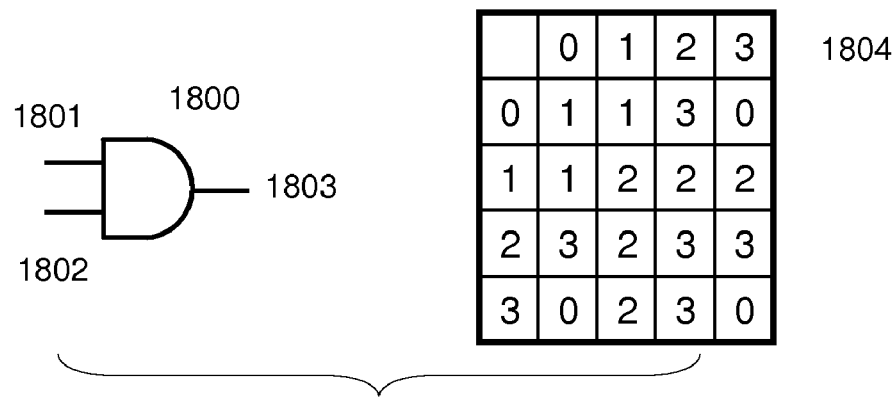
FIG. 40 is a diagram of a 4-value logic device with its truth table.

FIG. 40 shows a diagram of a 4-value logic device 1800 with inputs 1801 and 1802 and output 1803. Its functional behavior is determined by the 4-value truth table of 4-value logic function 'quat' shown in the following table.

|       | a |   |   |   |   |
|-------|---|---|---|---|---|
| quat  |   | 0 | 1 | 2 | 3 |
| b     | 0 | 1 | 1 | 3 | 0 |
|       | 1 | 1 | 2 | 2 | 2 |
|       | 2 | 3 | 2 | 3 | 3 |
|       | 3 | 0 | 2 | 3 | 0 |

Figure 41:
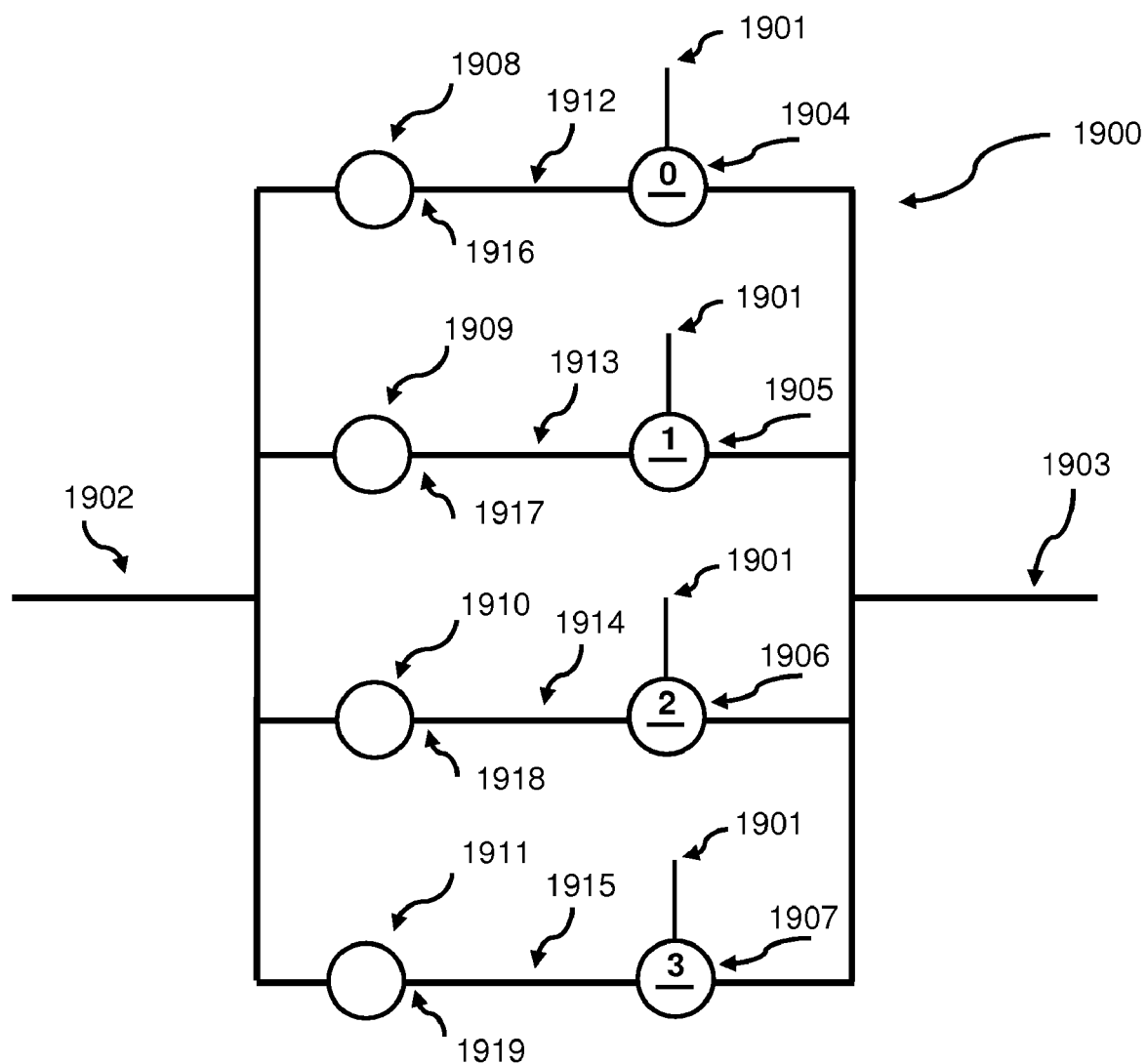
FIG. 41 is a diagram showing a realization of a 4-value logic function by applying gates and inverters.

FIG. 41 shows a possible realization of the device of FIG. 40. Its inputs 1901 and 1902 correspond with inputs 1801 and 1802 of the device in FIG. 40. The output 1903 of device 1900 corresponds with output 1803 of device 1800 in FIG. 40. The device has 4 channels: 1912, 1913, 1914 and 1915 connecting input 1902 with output 1903. Only one of the channels is conducting at the same time because of the gates 1904, 1905, 1906 and 1907. Gate 1904 is conducting for signal 1901 is 0; gate 1905 is conducting for control input value 1901 is 1, gate 1906 is conducting for control input 1901 is 2. And gate 1907 is conducting for control input 1901 is 3.

For this device to implement 4-value logic function 'quat' with the previous truth table, the inverters 1908, 1909, 1910 and 1911 have to be the same as respectively the second, third, fourth and fifth column of the truth table (the first column shows the possible input values).

If it is assumed for this example that only 4-value universal inverters are available, each of the inverters 1908, 1909, 1910 and 1911 has to be constructed from gates and the universal inverters i10, i17 and i19. Each of these inverters represents a column of the truth table of 'quat'. Each element of the column is determined by its row position.

The inverter 1908 in FIG. 41 represents column 1 of the truth table, which is shown in the following table.

| 1 |
|---|
| 1 |
| 3 |
| 3 |

Figures 42, 43:
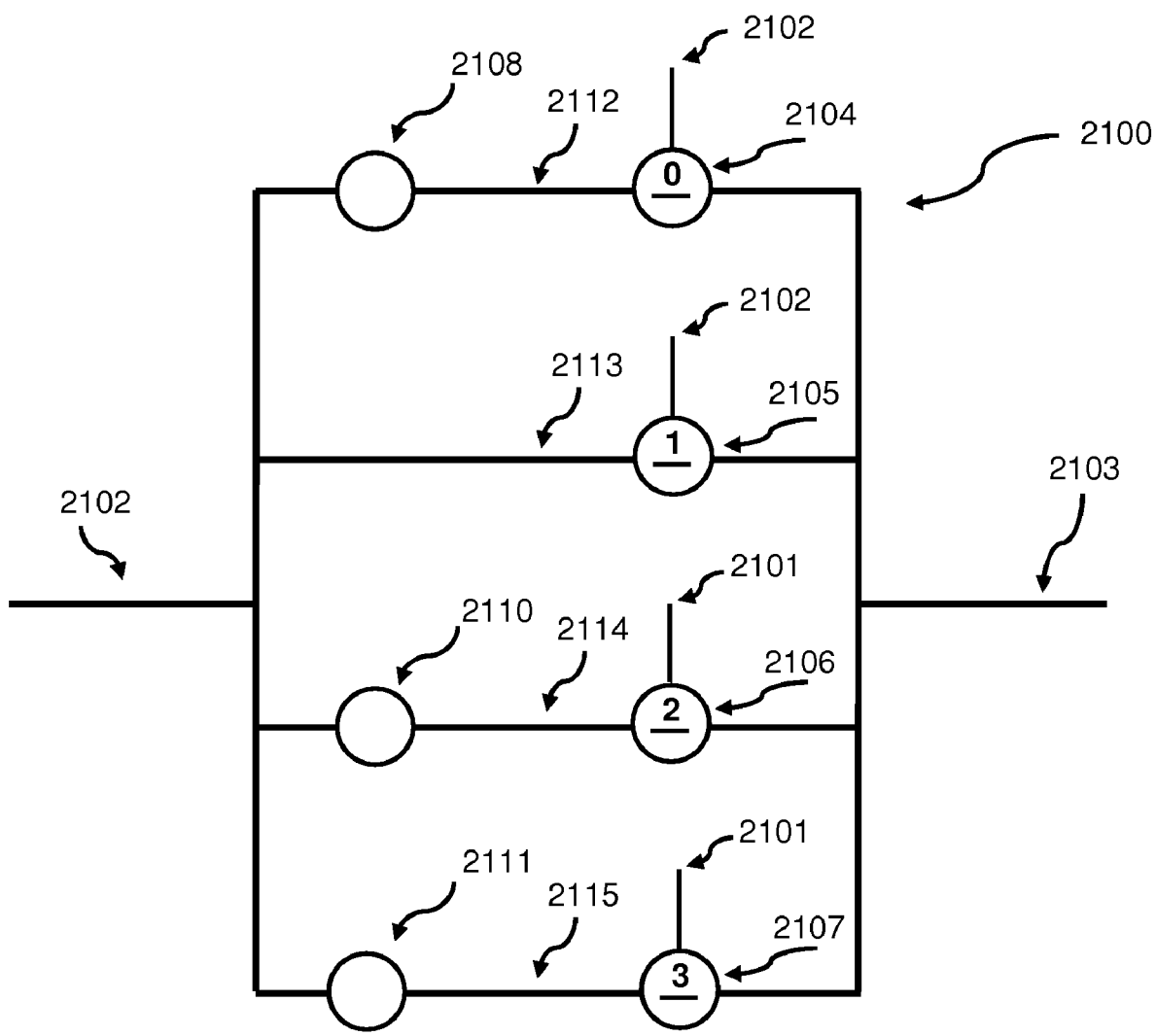
FIG. 42 shows a single column of a 4-value truth table.
FIG. 43 is a diagram showing a realization of a single column of a 4-value truth table of a 4-value logic function by applying gates and inverters.

This inverter can be realized with the device 2100 as shown in FIG. 43. The input 2102 corresponds with input 1902 of FIG. 41. The input 2102 is also used as the control input to the gates 2104, 2105, 2106 and 2107. The output 2103 corresponds with the output 1916 of the inverter 1908 in device 1900 in FIG. 41. The device 2100 has four sub-channels, 2112, 2113, 2114 and 2115 connecting the input 2102 of the inverter 2100 with its output 2103 through an inverter and a gate. Each sub-channel has a gate of which only one can be conducting at any given time. The inverters in the sub-channel have to be selected in such a way that each sub-channel when conducting presents the value of the element of the truth table that it is supposed to generate.

Sub-channel 2112 is supposed to present the value 1 (being the first element of the column shown before) when input 2102 has the value 0. This means that inverter 2108 has to be universal inverter i10. The universal 4-value inverter i10 transforms state 0 to state 1.

Sub-channel 2113 is supposed to present the value 1 (being the second element in the column shown) when input 2102 has the value 1. This means that the inverter has to be the identity i1 (or no inverter). With no inverter the input value 1 is passed through to the output when gate 2105 is conducting.

Sub-channel 2114 is supposed to present the value 3 (being the third element in the column shown) when input 2102 has the value 2. This means that the inverter has to be universal inverter i10. The universal inverter i10 transforms the input state 2 to state 3.

Sub-channel 2115 is supposed to present the value 0 (being the fourth element in the column shown) when input 2102 has the value 3. This means that the inverter has to be universal inverter i10. The universal inverter i10 transforms the input state 3 to state 0.

Consequently the inverter 1916 in device 1900 shown in FIG. 41 can be replaced by the device 2100 shown in FIG. 43, in which all universal inverters 2108, 2110 and 2111 in the sub-channels 2112, 2114 and 2115 are the 4-value universal inverters i10.

Figure 44:
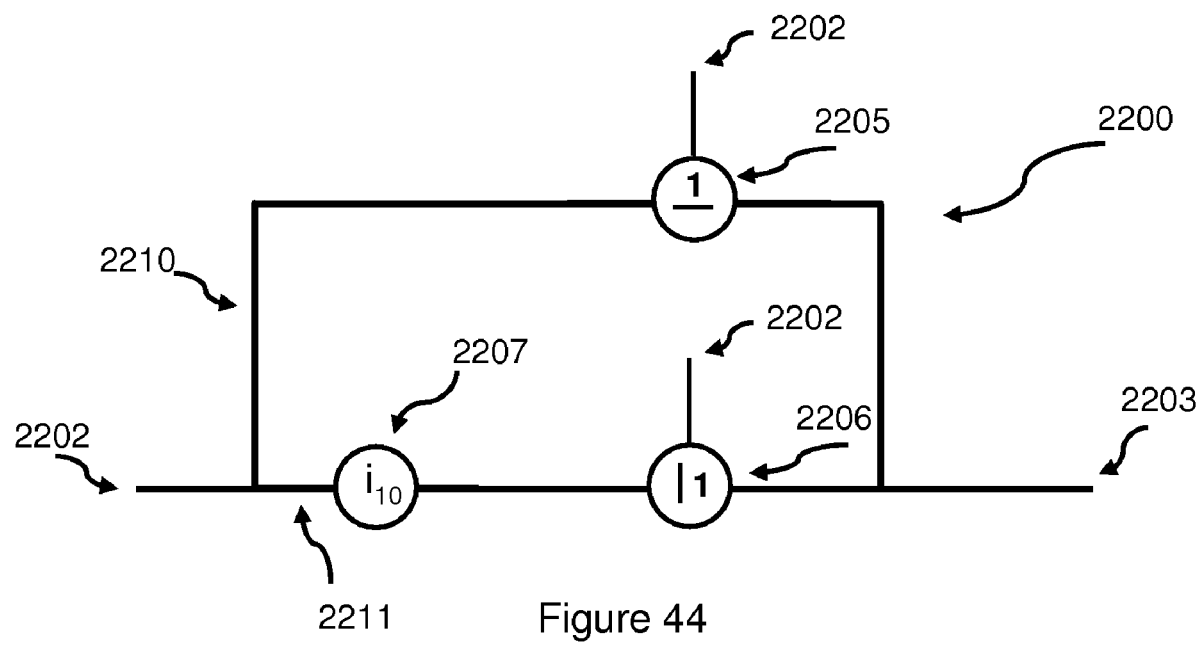
FIG. 44 is a diagram showing a realization of a single column of a 4-value truth table of a 4-value logic function by applying gates and inverters.

Because there are 3 identical inverters in 3 sub-channels it allows for further reduction as is shown in FIG. 44. The diagram of device 2200 as shown in FIG. 44, replaces effectively the device 2100 in FIG. 43.

Device 2200 has an input 2202, which also is the control input to the gates 2205 and 2206, and an output 2203. Input 2202 of device 2200 corresponds with input 2102 of device 2100. Output 2203 corresponds with output 2103 of device 2100.

While illustrative in nature the ternary and 4-value examples should make clear that any n-value logic function can be realized with gates and n-value universal inverters. Availability of different inverters and change in configurations can in many cases reduce the number of components of a realization.

Realization of Composite Multi-Valued Logic Expressions.

It has been shown that inverters and gates can be used to realize composite binary logic expressions. By using gates that are switched by the actual state of the input, rather than by the output state of the preceding logic device, execution of the expression can be significantly increased.

The invented approach is different from lookup table realization, which uses memory elements and where different output states have different output lines. A multiplexer usually selects and passes the appropriate output line.

The method described in this invention is a realization of a composite expression by consecutive implementation of individual components of the expression. This is done either by re-arranging the expression into individually realizable forms, or by creating a more desirable realization that is faulty, but differs in a number of output states with the required outputs and adds a so-called repair realization.

The invention works as well for ternary and multi-valued composite expressions by applying gates and inverters and switching the gates with the direct data inputs, rather than using the outputs of preceding logic devices.

As an illustrative example for applying the gate-inverter method the addition of two 2-digit n-valued numbers will be used.

| 2-digit number | | a | b |
|---|---|---|---|
| 2-digit number | | c | d |
| mod-n addition | | (a r1 c) | (b r1 d) |
| mod-n carry | (a c1 c) | (b c1 d) | |
| mod-n addition | (a c1 c) | (a r1 c) r1 (b c1 d) | (b r1 d) |

-continued

| | | |
|---|---|---|
| mod-n carry | {(a r1 c) c1 (b c1 d)} | |
| mod-n addition | (a c1 c) r1 {(a r1 c) c1 (a r1 c) r1 (b c1 d) (b c1 d)} | (b r1 d) |

A ripple adder requires the alternate determination of the modulo-n sum of corresponding digits and the determination of the carry digit. This process has to continue until no more carry digits are generated. Determining the most significant digit of the sum may require the greatest number of logic operations. This is shown in the previous table.

The expression determining the expression:

s→(a c1 c)r1{(a r1 c)c1(b c1 d)} will be used for the example.

Assuming that the expression is one in ternary logic, the ternary logic functions r1 and c1 can be described by the following ternary truth tables: r1 for the modulo-3 addition and c1 for determining the modulo-3 carry.

| | r1 | | |
|---|---|---|---|
| | 0 | 1 | 2 |
| 0 | 0 | 1 | 2 |
| 1 | 1 | 2 | 0 |
| 2 | 2 | 0 | 1 | and

| | c1 | | |
|---|---|---|---|
| | 0 | 1 | 2 |
| 0 | 0 | 0 | 0 |
| 1 | 0 | 0 | 1 |
| 2 | 0 | 1 | 1 |

Figure 45:
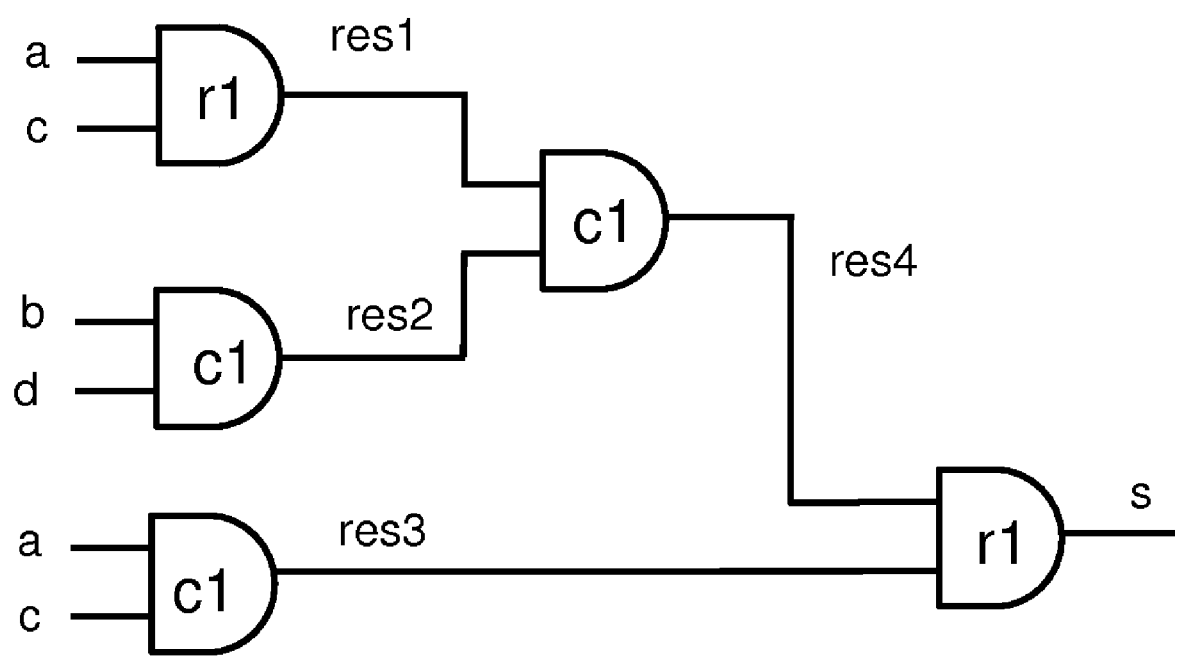
FIGS. 45 to 49 illustrate various realizations of the circuit of FIG. 45.

FIG. 45 shows the 'classical' realization of the illustrative composite logic expression. The signals have to propagate through three levels before the final output is generated. The reason for this is, as stated before, causality: a previous result has to be present before the next on can be executed. It is noted that all required inputs are available at the same time, so there may be a physical reason but there is no logic reason why there should be a propagation delay.

Figure 46:
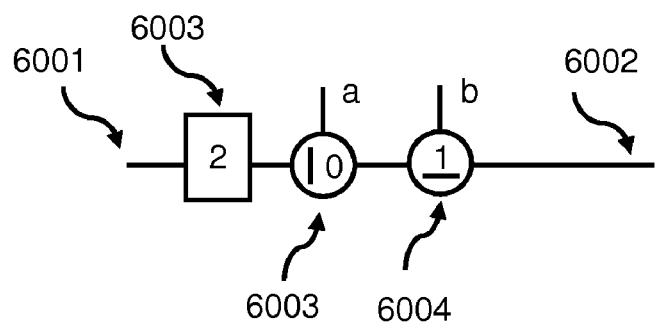

In accordance with the present invention, there are different ways to realize individual states of a logic function combined with gates. FIG. 46 shows a diagram of a realization of a single state based on the inputs 'a' and 'b'. The output 6002 does not depend on the input 6001, but reflects the value of the constant source 6005, depending on the status of the two gates 6003 and 6004. The output 6002 has the status 2 when the control input 'a' to the gate 6003 is not in state 0 and the control input 'b' to gate 6004 is in state 1. In all other cases the output 6002 has no signal (which may or may not be defined as state 0).

FIG. 47 shows the diagram of the realization of the ternary function 'c1' with gates and inverters. The truth table of 'c1' has the following three columns which can be interpreted as inverters:

| C10 | c11 | c12 |
|---|---|---|
| 0 | 0 | 0 |
| 0 | 0 | 1 |
| 0 | 1 | 1 |

The diagram in FIG. 47 has two branches, one with gate 6103 and inverter 5105 c11=[0 0 1] and one branch with gate 6104 and inverter 6106 c12=[0 1 1]

Assuming the state 0 is 'absence of signal', the inverter c10=[0 0 0] is automatically realized when the branches with the other inverters c11 and c12 are not active.

The input 6101 has one of two ternary input signals and the control input of gates 6103 and 6104 have the other ternary input signal as their controlling input. Gate 6103 is conducting when its control input has state 1 and gate 6104 is conducting when its control input has state 2.

The same method applies to the columns of the ternary logic function r1. The first column is r10=[0 1 2] which is identity. The second column is r12=[1 2 0] and the third column is r12=[2 0 1].

Figure 48:
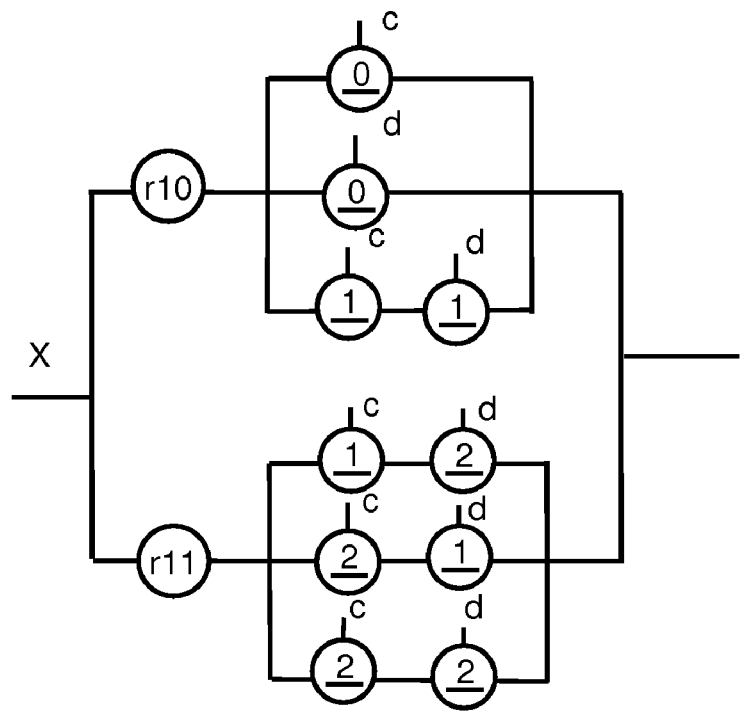

The diagram of FIG. 48 shows the realization of the ternary logic circuit of FIG. 45 realized with inverters and gates. In this 'classic' realization there is structural propagation delay as the next circuit has to wait for the result of the previous circuit. In this diagram, the minimizing possibilities of state 0 being 'absence of signal' hare ignored.

Next it will be shown how the expression: s→(a c1 c)r1{(a r1 c) c1 (b c1 d)} can be re-arranged and then realized with gates and inverters. First the order of the components will be re-arranged so that it will now appear as: s→{(a r1 c) c1 (b c1 d)} r1 (a c1 c). The purpose is that each partial expression will process the incoming signal by applying gates and inverters, but in such a way that the states of the gates strictly depend on the initial inputs and not on the output of the preceding device.

FIG. 48 shows how a composite ternary logic expression like: X r1 (a c1 c) can be realized. The easiest way to do this is when logic expressions are associative such as: X y1 (a y2 c)=((X y1 a) y2 c). However this is usually not the case.

The ternary expression X r1 (a c1 c) means in terms of gates and inverters that the signal X will be transformed by either inverter r10, or r11 or r12 depending on the result of the expression (a c1 c). The expression (a c1 c) has two possible output states either 0 or 1 (see its previous truth table). All output states and the related input states are shown in the next table.

| (a c1 c) | (a, c) | (a, c) | (a, c) | (a, c) | (a, c) | (a, c) |
|---|---|---|---|---|---|---|
| 0 | (0, 0) | (0, 1) | (0, 2) | (1, 0) | (1, 1) | (2, 0) |
| 1 | (1, 2) | (2, 1) | (2, 2) | | | |

For convenience it can be said that (a c1 c) is 0 when either a=0, c=0 or (a,c)=(1,1). And (a c1 c) is 1 when either (a,c)=(1,2), (a,c)=(2,1) or (a,c)=(1,1).

When (a c1 c)=0 the variable signal X sees inverter r10 (or identity) and when (a c1 c)=1 the variable signal X sees inverter r11. The expression (a c1 c) can never have value 2.

The diagram of FIG. 48 shows the realization of X r1 (a c1 c). The inverter r10 is the he identity. The input signal X will not see an inverter r12 because the state 2 can not be realized by (a c1 c).

Figure 48A:
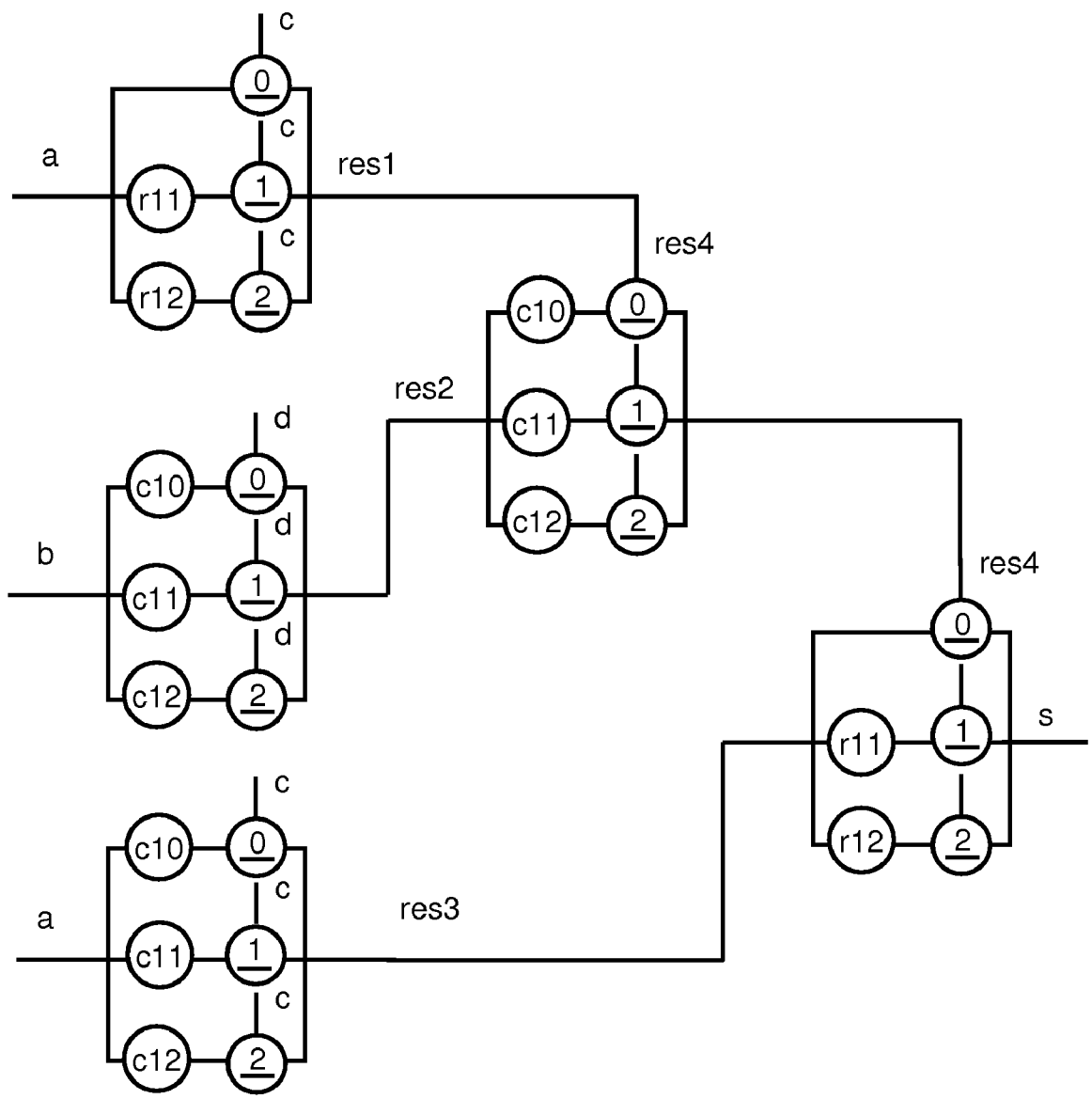
Figure 49:
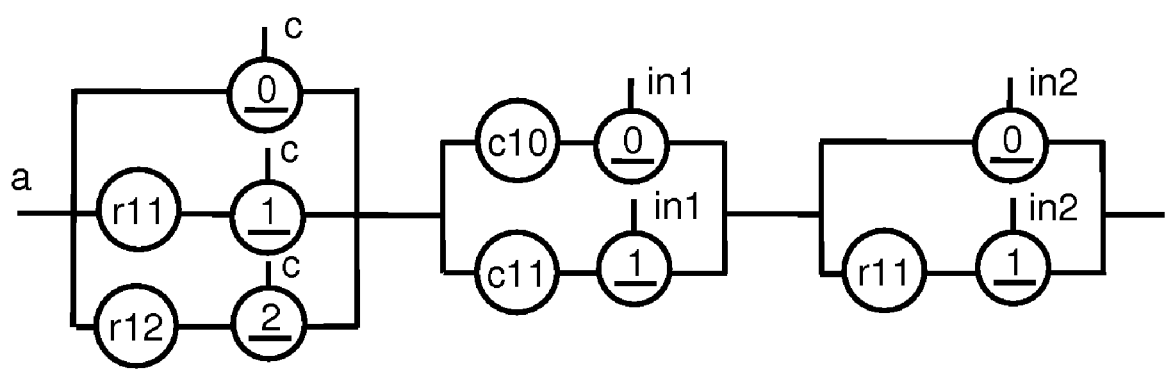

The realization of the expression: s→{(a r1 c) c1 (b c1 d)} r1 (a c1 c) is shown in FIG. 48A. The 'composite' gates are controlled by control inputs in1=(b c1 d) and in2=(a c1 c). From the previous analysis it is clear that in1 and n2 strictly depend on input signals b and d and a and c and not on the output of the previous device. This is shown in the following tables:

| in1 = (b c1 d) | (b, d) | (b, d) | (b, d) | (b, d) | (b, d) | (b, d) |
|---|---|---|---|---|---|---|
| 0 | (0, 0) | (0, 1) | (0, 2) | (1, 0) | (1, 1) | (2, 0) |
| 1 | (1, 2) | (2, 1) | (2, 2) | | | |

| in2 = (a c1 c) | (a, c) | (a, c) | (a, c) | (a, c) | (a, c) | (a, c) |
|---|---|---|---|---|---|---|
| 0 | (0, 0) | (0, 1) | (0, 2) | (1, 0) | (1, 1) | (2, 0) |
| 1 | (1, 2) | (2, 1) | (2, 2) | | | |

Like in the binary case a 'repair' can be applied to a realization in the ternary and multi-value case that differs in some output states from the desired states.

For instance the expression s1→((((a r1 c) c1 b) c1 d) r1 a) c1 c) differs in 6 of the 81 states from the output of s→{(a r1 c) c1 (b c1 d)} r1 (a c1 c). One can create the correct output values as desired from 's' by realizing 's1' and by adding 6 individual 'repair' states. As in the binary case these 'repairs' are easier to add when the state 0 is represented by 'absence of signal'.

The herein described example is for illustrative purposes only. The invented method is applicable to any n-value logic by applying the appropriate gates and inverters.

Realization of One of n Multi-Value States by 'Absence of Signal'.

The realization of n-valued logic may include one of n states as being represented by 'absence of signal'. This representation can reduce the number of components in a realization. The reason for this is that the state that is represented by 'absence of signal' is implicitly generated by the realization of other states. For instance a composite ternary expression may generate the states 0, 1 and 2. Suppose the state 0 is represented by 'absence of signal'. Only the devices that realize states 1 and 2 have to be realized. If the state is not 1 or 2, neither of these state realizations will generate an output and have automatically generated the required state 0 by 'absence of signal'.

PREFERRED EMBODIMENT FOR GATES AND INVERTERS

As many apparently different embodiments of this invention may be made without departing from the spirit and scope thereof, it is to be understood that the invention is not limited to the specific embodiments thereof.

Figure 50:
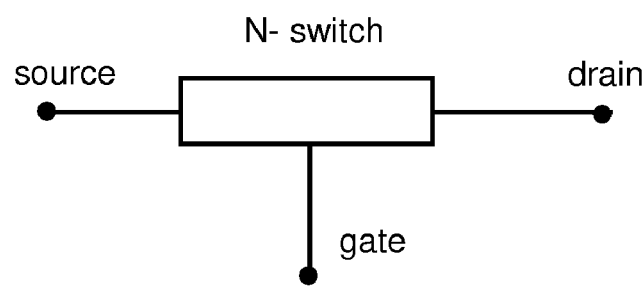
FIG. 50 is a diagram of an N-channel switch.
Figure 51:
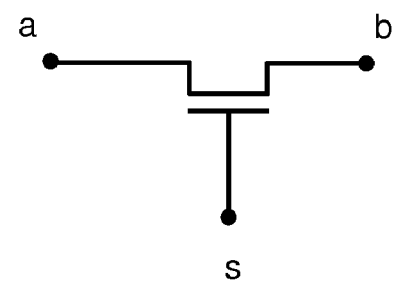
FIG. 51 is a diagram for an nMOS switch.
Figure 52:
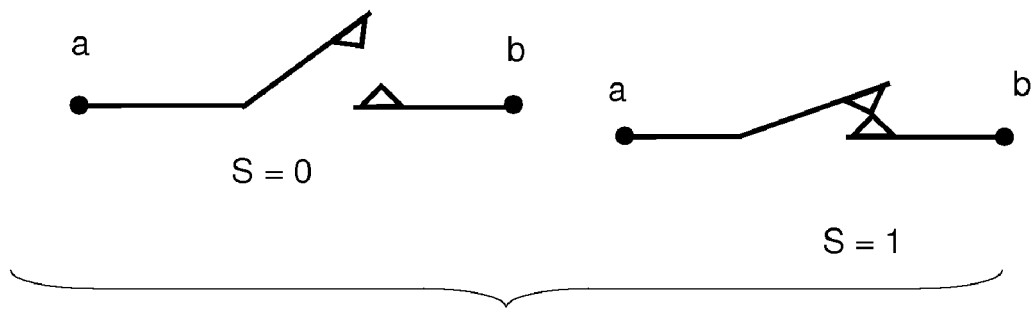
FIG. 52 shows the switching states for an nMOS switch.

Binary digital electronic gates are well known. Examples are MOS transistor switches. These switches, as described for instance in the textbook "Principles of CMOS VLSI Design: a Systems Perspective" by Neil Weste and Kamran Eshraghian, comprise a source and a drain as shown in FIG. 50. In case of the nMOS transistor switch of which a diagram is shown in FIG. 51, a conducting channel between the source and the drain is enabled when the gate has a 'high' voltage (S=1) imposed on it. When the gate voltage is low (S=0), there is no conducting channel between the source and the drain. A switching diagram is shown in FIG. 52. The actual level of the enabling voltage varies with several material properties. However, in a binary logical sense, one may say that this switch is conducting when the controlling signal is NOT LOW and the switch is non-conducting when the control signal is LOW.

Figure 53:
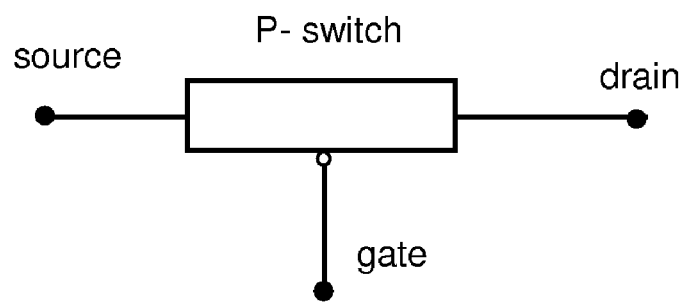
FIG. 53 is a diagram for a P-channel switch.
Figure 54:
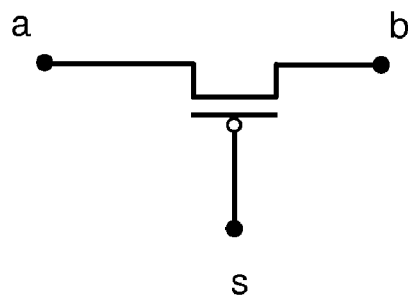
FIG. 54 is a diagram for a pMOS switch.
Figure 55:
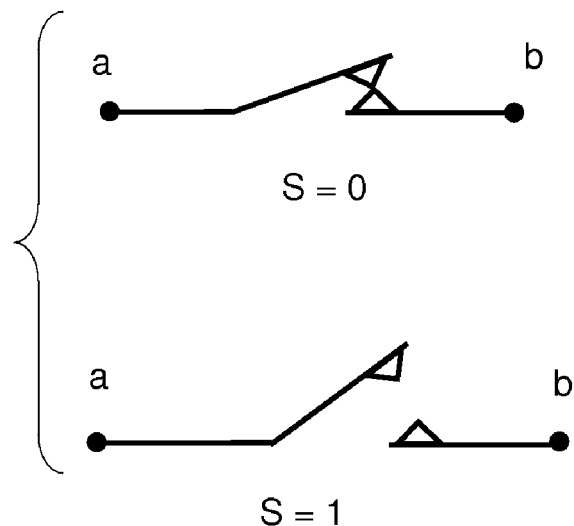
FIG. 55 shows the switching states for a pMOS switch.

In the case of the pMOS transistor switch, as shown in FIG. 53, a conducting channel between the source and drain is enabled when the control signal on the gate is low (S=0). When the control signal is high (S=1) no conducting channel is enabled. FIG. 55 shows a diagram for the switching states. FIG. 54 shows the symbolic diagram for a pMOS transistor switch.

It is known from the literature and previously granted patents (see U.S. Pat. No. 6,133,754) that it is possible to realize ternary and n-value inverters (called one-place function), in standard CMOS technology.

The requirement for applying a common technology for a switching gate for any n-value logic (with n an integer greater than 2) is that a gate is either conducting or non-conducting for a common state. All n-value logics with n greater than 2, have 3 states in common: 0, 1 and 2.

Because pMOS and nMOS transistor switches demonstrate the desired switching behavior at state 0 (or low), this state has been selected as the switching state for all other n-value logic gates. Availability of inverters makes it possible to transform any n-value state to 0. This makes the nMOS and pMOS switches universally adaptable for any n-value logic.

For practical purposes it should be noted that nMOS and pMOS switches operate at a certain threshold. It should also be noted that in its generic configuration the threshold level and the switched voltage are directly related. It may be that the physical voltage levels representing the states of n-value inverters do not coincide with the threshold level and or the maximum control levels of the nMOS and pMOS switches. Furthermore, the maximum voltage levels of the switches from input-to-output have an upper limit, generally called the saturation level. In case. For multi-value level switching purposes, the switches should be operated below saturation levels. And because of multi-value requirements switches should operate in a voltage range that is as close to a linear performance between input and output levels as possible.

Where it is necessary to connect outputs of multiple gates together, it may be necessary to use an output that provides a don't care state (or a high impedance state) so that disabled gates do not drive the output. This is commonly referred to as a high impedance output, and may be needed when using electronic based switches.

Figure 55A:
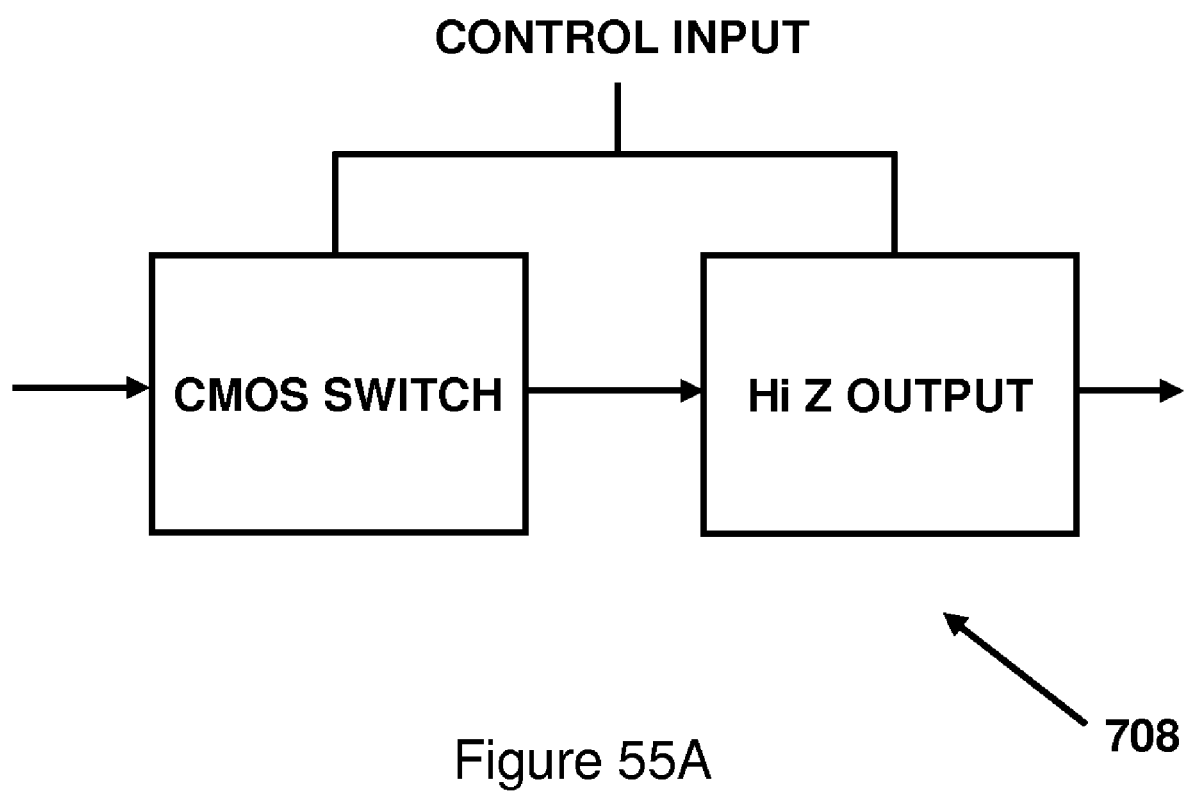
FIG. 55A shows a gate with a high impedance output circuit.

FIG. 55A illustrates an electronic gate having a don't care or high impedance output. A CMOS switching device, such as the ones previously disclosed receives an output and drives a high impedance output circuit. The control input switches the CMOS device and controls the output circuit. The output circuit is driven into a high impedance state when the CMOS switch is disabled or in a non-conducting state. The output circuit is put in a normal impedance state when the CMOS switch is enabled or conducting, so that the input drives the output.

Thus, in prior circuits, where electronic gates are used and the outputs of the gates are connected, a high impedance output circuit is included as part of the gate. So, by way of example only, in FIG. 29, the gates 708, if implemented electronically, will include high impedance output drivers as illustrated in FIG. 55A.

Such high impedance output drivers are well known in the art. There are known binary devices that provide such an output. Also, there are known solutions in the multi-value environment as well.

Of course the gates in this application can be implemented via other physical devices, such as, optical and mechanical switching devices. Separate high impedance outputs are not believed necessary in these cases.

Figure 56:
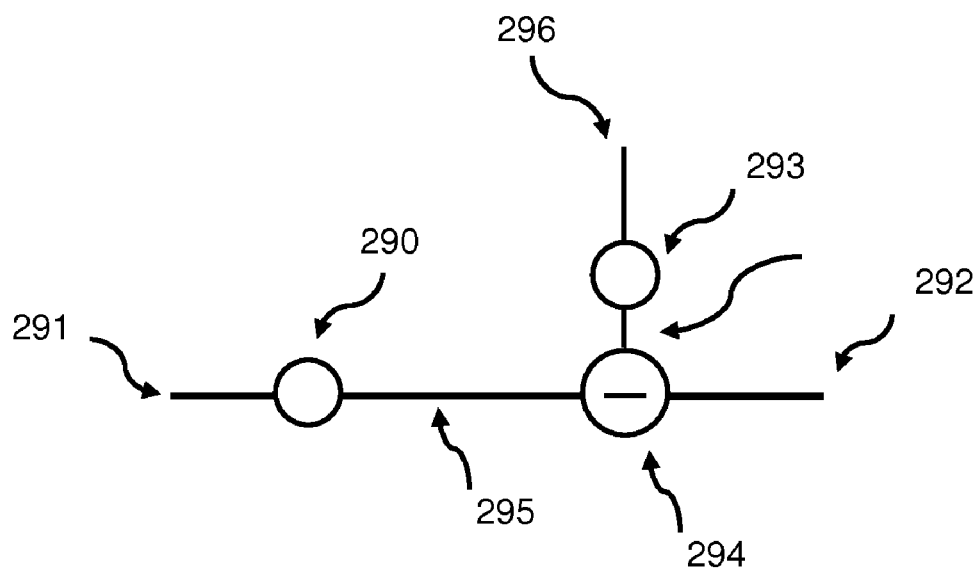
FIG. 56 is a diagram for a logic circuit realized from a gate and two inverters.

FIG. 56 shows a logical embodiment of a gate (294) with an inverter (293) in its control input (296) and an inverter (290) in its logic signal path starting at input 291 to output 292. While the logic state of the inputs 291 and 296 may be identical, the physical signals may have different values. Furthermore the logic states at 291 and 296 may be different. Assuming that gate 294 will be an on/off switch, controlled by an input 298 (being the output of an inverter), then the control signal at input 298 should be such that it acts as an individual enabling signal (independent from the input signal at 291) to the gate 294.

Individually (analog and linear) enabled switches in CMOS are well known. In order to apply these switches in the n-value case the level of the control input signal 296 has to be adapted to the on/off requirements of gate 294.

Figure 57:
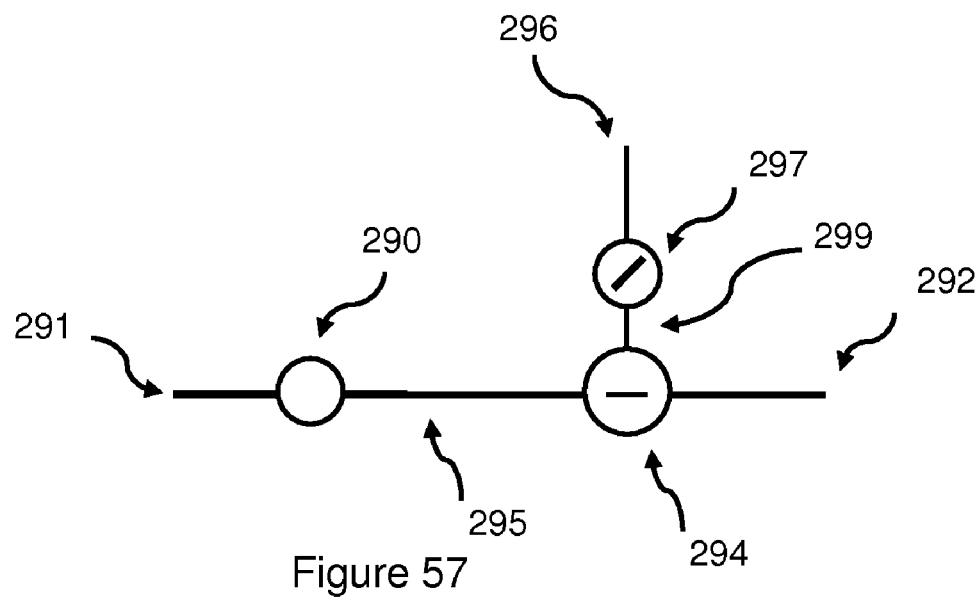
FIG. 57 is a diagram for a logic circuit in which the control signal is processed by a signal conditioner.

FIG. 57 shows a diagram of a circuit to achieve this by replacing the logic inverter 293 with an output 298 in FIG. 56 by the inverter 293 serially connected with a combined comparator/signal conditioning circuit 297 with an output 299.

The circuit 297 is such that its output 299 meets the requirements for an individually enabling on/off control for the gate 294. Such a circuit 297 is well known to those of ordinary shill in the art.

Figure 58:
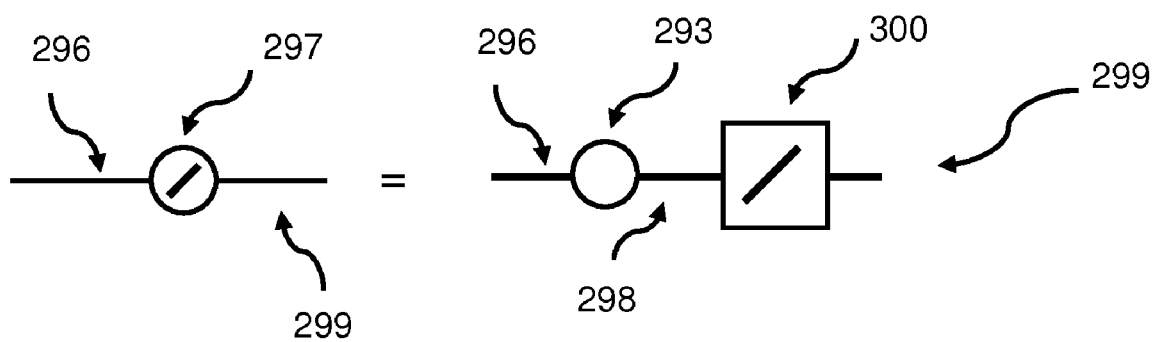
FIG. 58 is a diagram showing a signal conditioner for a gate control signal.

The circuit 297 in FIG. 57 is also shown in FIG. 58. It comprises the inverter 293 connected with a circuit 300 that performs two functions. First it performs a comparator function and determines if the signal at output 298 represents the state 0 of the inverter. The gate 294 in FIG. 56 is conducting when the control input state is 0. The circuit 300 will be created such that an output signal will be generated that will put the gate in a conducting mode. If the inverter 293 generates a logic state that would make the gate non-conducting, circuit will generate a signal that will make the gate 294 non-conducting, complying with the physical control requirements of the individually enable switch.

Because of the availability of n-value inverters the embodiment of the gate control can be reduced to a standard analog individually enabled logic switch.

A somewhat similar problem could be faced by an n-value physical signal on the output 295 of inverter 290 in FIGS. 56 and 57. The gate 294 in FIG. 56 should be applied in a linear mode, such that input 291 and output 292 of the circuit are directly and linearly related. This requires a conditioning of the signal at output 295 in such a way that only for the highest valid output signal of inverter 290 the gate goes into saturation. For all other signal values the gate should operate in a linear mode. For practical reasons there should be a sufficient difference in signal level between the saturation level and the second highest signal level representing a logic state.

In order to create an input signal 302 to the gate that will meet these requirements, a circuit 300 will be connected to inverter 290 that will have as its input the inverter output 295 and an output 302. The combination of n-value inverter 290 with signal conditioning circuit 300 can then be replaced, as shown in FIGS. 59 and 60, by a circuit 301 with an input 291 and an output 302.

Figure 59:
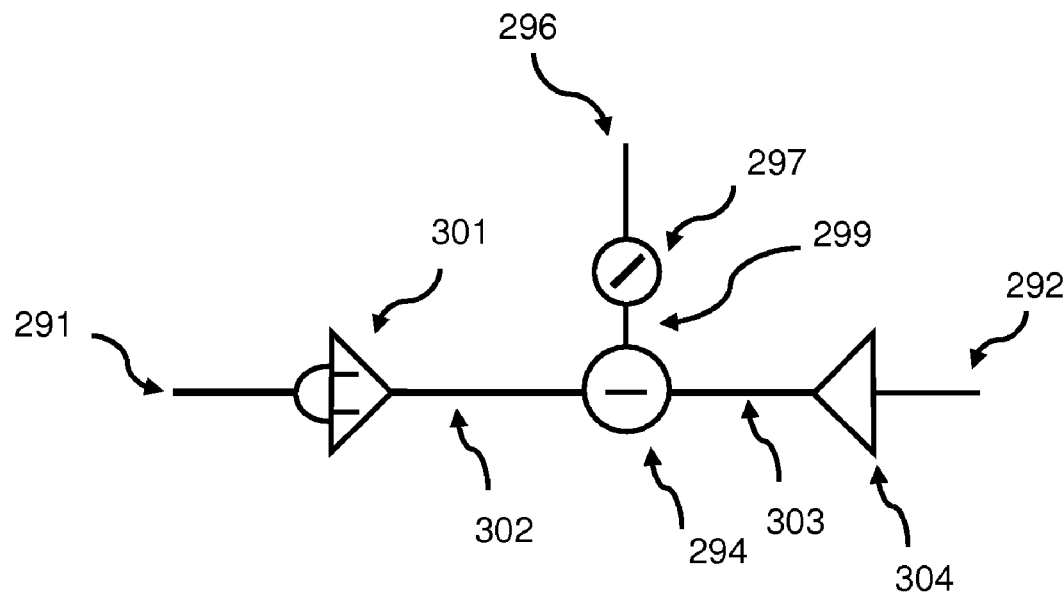
FIG. 59 is a diagram of a logic circuit with signal conditioners.
Figure 60:
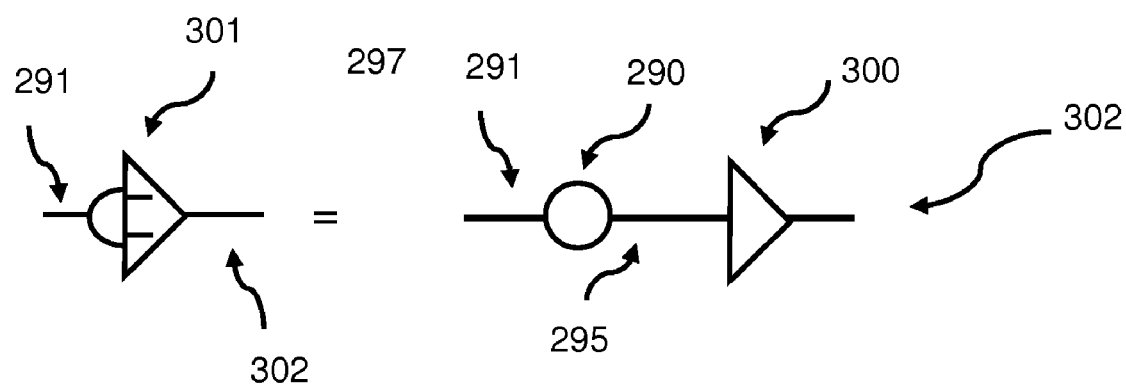
FIG. 60 is a diagram showing a signal conditioner for the logic signal.

The output of the gate 294 in linear mode is 303, as shown in FIG. 59. To bring the signals back to the level for processing by n-value inverters a signal conditioner 304, functioning as the reverse of conditioner 301, will be applied. The input to the conditioner 304 is 302 and the output of signal conditioner 304 is 292, corresponding with the output 292 in FIG. 56.

Figure 61:
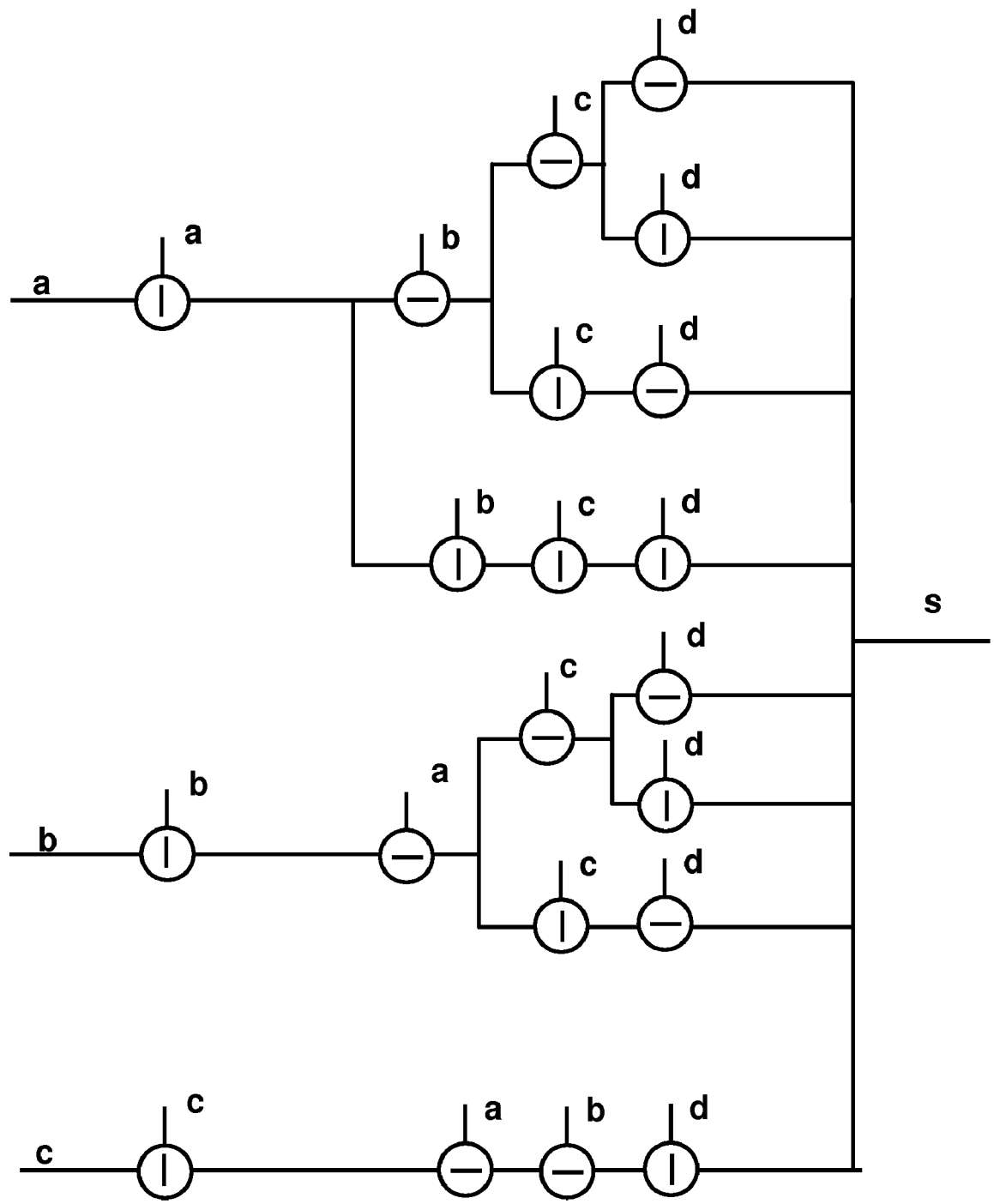
FIG. 61 is a somewhat minimized circuit of the circuit in FIG. 18.

FIG. 61 illustrates a somewhat minimized version of FIG. 18.

The following patent applications, including the specifications, claims and drawings, are hereby incorporated by reference herein, as if they were fully set forth herein: (1) U.S. Provisional Patent Application No. 60/575,948, filed on Jun. 1, 2004, entitled MULTI-VALUE CODING OF SEQUENCES AND MULTI-VALUE MEMORY DEVICES; (2) U.S. Non-Provisional patent application Ser. No. 10/935,960, filed on Sep. 8, 2004, entitled TERNARY AND MULTI-VALUE DIGITAL SCRAMBLERS, DESCRAMBLERS AND SEQUENCE GENERATORS; (3) U.S. Provisional Patent Application No. 60/547,683, filed Feb. 25, 2004, entitled TERNARY AND MULTI-VALUE DIGITAL SCRAMBLERS, DESCRAMBLERS AND SEQUENCE GENERATORS; (4) U.S. Non-Provisional patent application Ser. No. 10/936,181, filed Sep. 8, 2004, entitled TERNARY AND HIGHER MULTI-VALUE SCRAMBLERS/DESCRAMBLERS; (5) U.S. Non-Provisional patent application Ser. No. 10/912,954, filed Aug. 6, 2004, entitled TERNARY AND HIGHER MULTI-Comment VALUE SCRAMBLERS/DESCRAMBLERS; and (6) U.S. Provisional Patent Application No. 60/501,335, filed Sep. 9, 2003, entitled TERNARY (3-VALUE) AND HIGHER VALUE DIGITAL SCRAMBLERS/DESCRAMBLERS IN DIGITAL COMMUNICATIONS.

The invention claimed is:

1. A device implementing an n-valued logic function with n>2, comprising:
    an n-valued switch having an input and an output and a control input, wherein:
        the input is enabled to receive a signal having one of n states;
        the input is connected to the output whenever the control input is in a first of n-states; and
        the input is isolated from the output whenever the control input is not in a first of n-states; and
    an n-valued inverter.

2. The device as claimed in claim 1, wherein the n-valued inverter is reversible.

3. A method for implementing an n-valued logic function with n>2, having an n by n truth table with n rows and n columns comprising:
    implementing a row of the n by n truth table by an n-valued inverter; and
    enabling the n-valued inverter by an n-valued switch having a control input.

4. The method as claimed in claim 3, wherein:
    the n-valued switch further having an input and an output, wherein:
        the input is enabled to receive a signal having one of n states;
        the input is connected to the output whenever the control input is in a first of n-states; and
        the input is isolated from the output whenever the control input is not in a first of n-states.

5. The method as claimed in claim 3, wherein the n-valued inverter implements
    a column instead of a row of the n by n truth table.

6. A device implementing an n-valued logic function with n>2 having 2 inputs and 1 output which is determined by a truth table, comprising:
  an n-valued switch including an input, a control input and an output, the input enabled to receive a signal representing one of n logic states, the control input enabled to receive a signal representing one of n logic states and the output enabled to provide a signal representing one of n logic states, wherein:
    the output of the n-valued logic switch provides a signal representing the one of n logic states represented by the signal received at the input of the n-valued switch whenever the control input receives a signal representing a first of n logic states; and
    the output of the n-valued logic switch provides a signal that corresponds with an absence of signal at the input, whenever the control input receives a signal not representing a first of n logic states.

7. The device as claimed in claim 6, further comprising an n-valued inverter with an input and an output, the output of the inverter being connected to the input of the n-valued switch.

8. The device as claimed in claim 7, wherein the inverter represents a column or a row of the truth table.

9. The device as claimed in claim 6, wherein absence of signal represents one of n logic states.

* * * * *